(12) United States Patent
Noda et al.

(10) Patent No.: US 6,392,942 B2
(45) Date of Patent: May 21, 2002

(54) SEMICONDUCTOR MEMORY DEVICE HAVING A MULTI-LAYER INTERCONNECTION STRUCTURE SUITABLE FOR MERGING WITH LOGIC

(75) Inventors: Hideyuki Noda; Takeshi Fujino, both of Hyogo (JP)

(73) Assignee: Mitsubisishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/748,140

(22) Filed: Dec. 27, 2000

(30) Foreign Application Priority Data

Dec. 27, 1999 (JP) .......................................... 11-368985

(51) Int. Cl.⁷ ................................................ G11C 7/00
(52) U.S. Cl. ................................... 365/205; 365/230.03
(58) Field of Search ............................ 365/205, 230.03, 365/230.06, 208, 212, 197, 191, 196

(56) References Cited

U.S. PATENT DOCUMENTS

| | | | |
|---|---|---|---|
| 5,321,646 A | | 6/1994 | Tomishima et al. ............ 356/51 |
| 6,043,562 A | * | 3/2000 | Keeth .......................... 257/776 |
| 6,091,656 A | * | 7/2000 | Ooishi ......................... 365/226 |

FOREIGN PATENT DOCUMENTS

| | | |
|---|---|---|
| JP | 4-94569 | 3/1992 |
| JP | 5-151776 | 6/1993 |

* cited by examiner

*Primary Examiner*—David Nelms
*Assistant Examiner*—Thong Le
(74) *Attorney, Agent, or Firm*—McDermott, Will & Emery

(57) ABSTRACT

Signal lines running within a sense amplifier band provided extending in a row direction in a memory array portion are formed in a hierarchical structure having an upper interconnection layer and a lower layer interconnection layer. Thus, a semiconductor memory device suitable for merging with logic and capable of effectively utilizing a multi-layer interconnection structure in the memory array portion can be provided.

20 Claims, 18 Drawing Sheets

F I G. 4
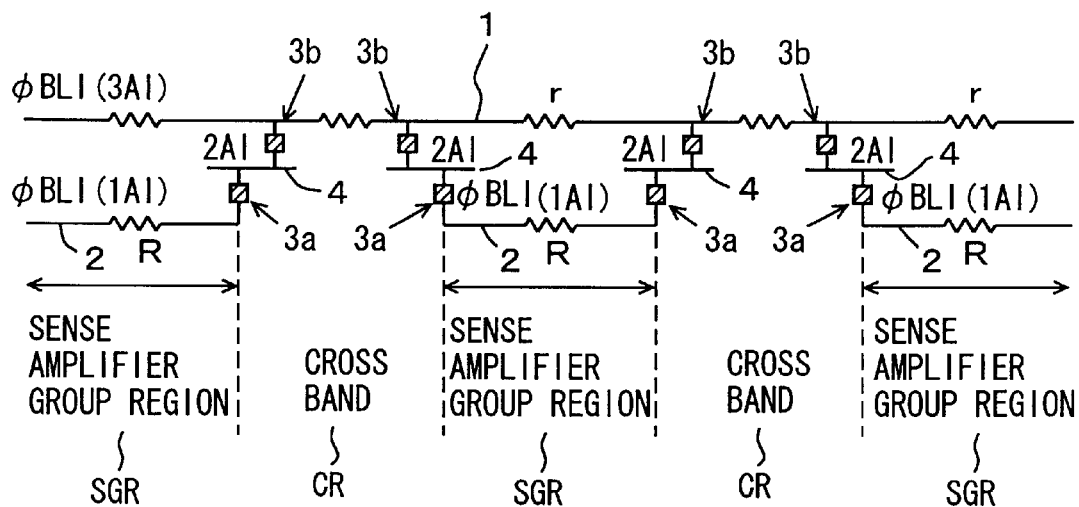
F I G. 5
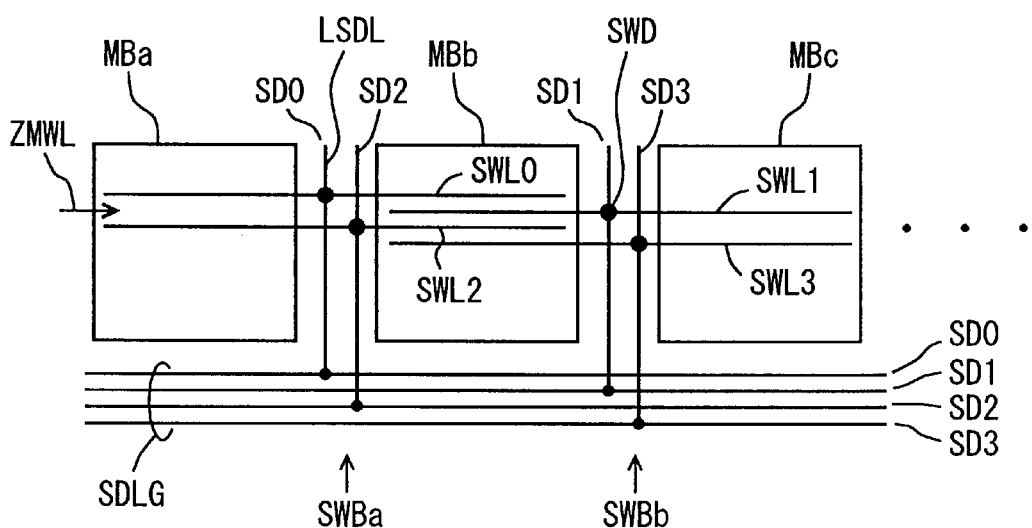

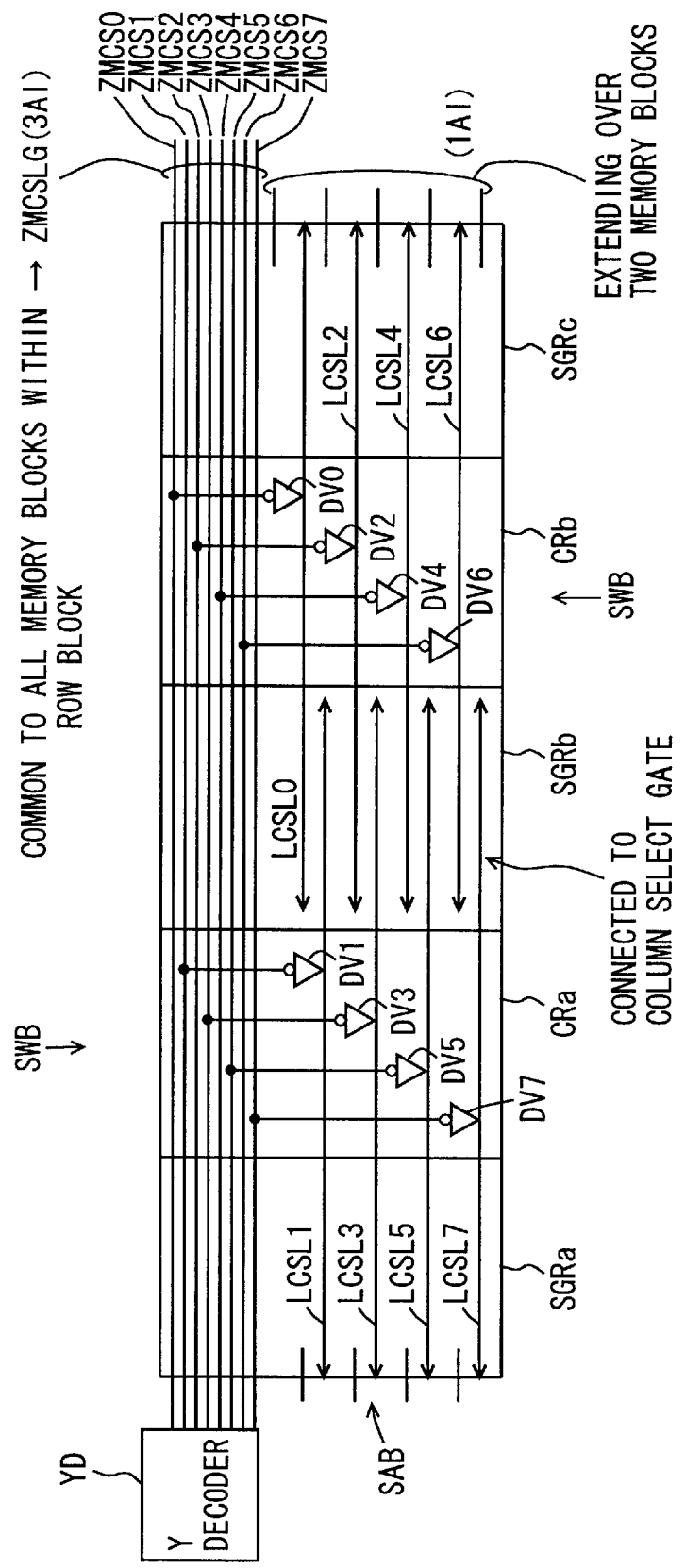
F I G. 15

ARRANGED IN REGION 90 OR REGION 92

F I G. 2 0
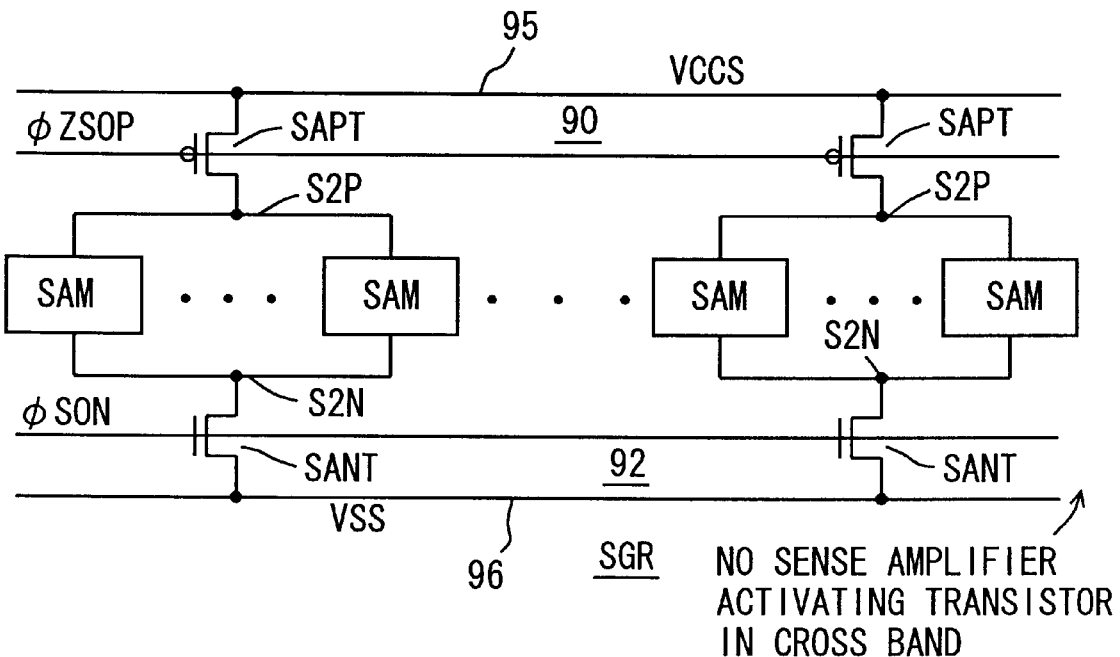
NO SENSE AMPLIFIER
ACTIVATING TRANSISTOR
IN CROSS BAND
F I G. 2 1
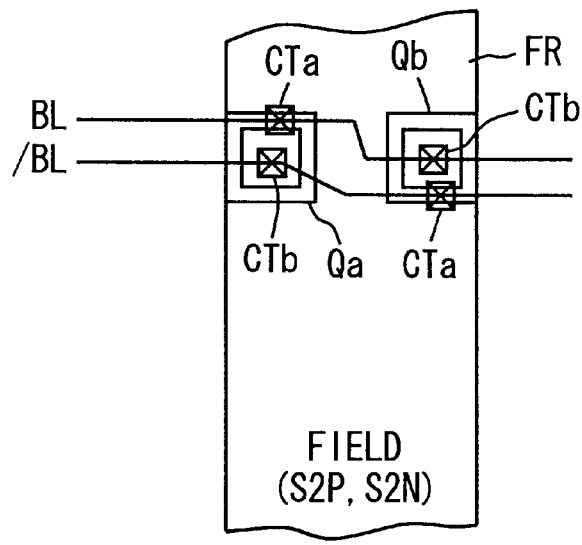

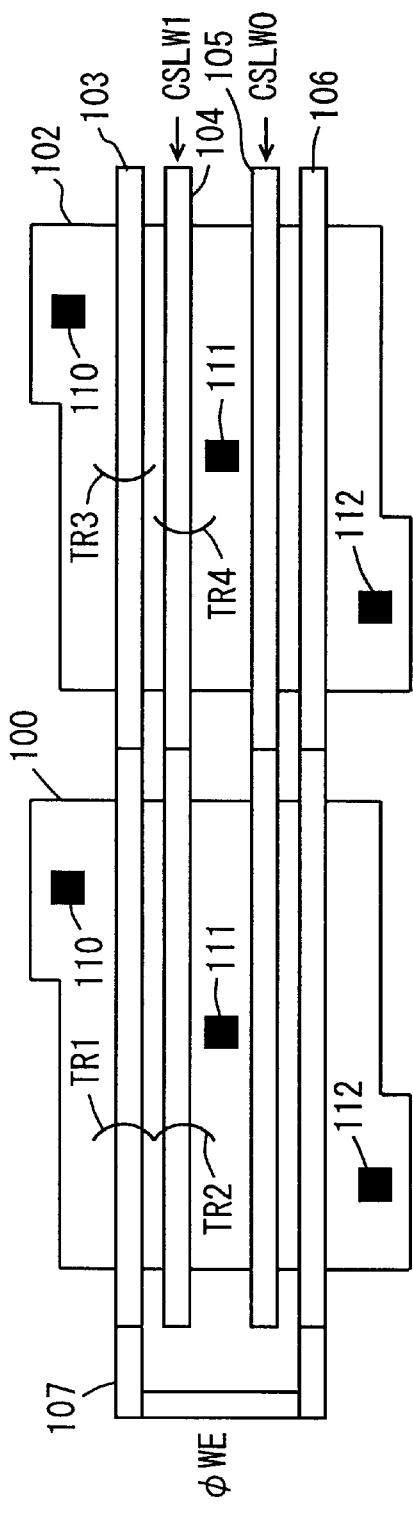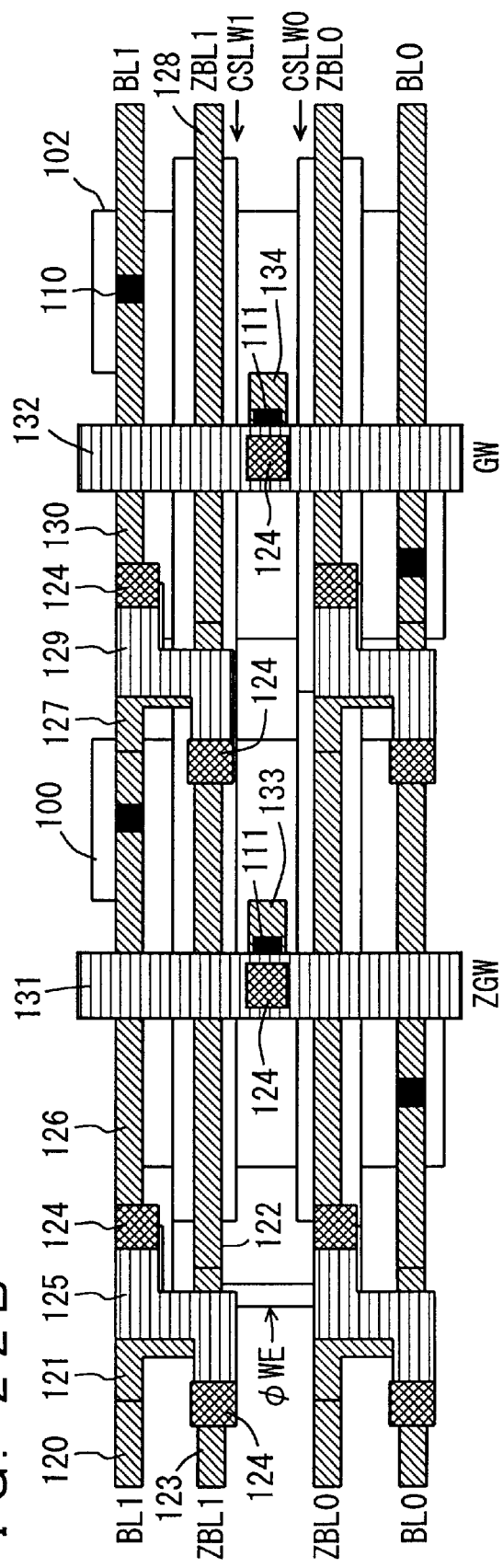
FIG. 22A
FIG. 22B

SEMICONDUCTOR MEMORY DEVICE HAVING A MULTI-LAYER INTERCONNECTION STRUCTURE SUITABLE FOR MERGING WITH LOGIC

BACKGROUND OF THE INVENTION

1. Field of the Invention

The present invention relates to a semiconductor memory device, and particularly to a semiconductor memory device having a multi-layer interconnection structure. More specifically, the present invention relates to an interconnection structure of a semiconductor memory device suitable for merging with logic.

2. Description of the Background Art

FIG. 27 is a schematic representation of an arrangement of a logic-merged memory. In FIG. 27, logic-merged memory 900 includes a logic 902 for performing a prescribed processing, a memory 904 for storing necessary data for logic 902, and an internal bus 906 for interconnecting logic 902 and memory 904. Memory 904 is normally formed by a dynamic random access memory (DRAM). Logic 902 and memory 904 are formed on the same semiconductor chip, and internal bus 906 connecting the two can have a sufficiently wide bus width. Therefore, being free from the restrictions of the pin terminals of memory 904, internal bus 906 can be made to have a sufficiently narrow interconnection line pitch. In addition, internal bus 906 is internal interconnection lines so that each parasitic impedance is small, which allows a high-speed data transfer between logic 902 and memory 904. Moreover, the parasitic capacitance of the internal interconnection lines of internal bus 906 is small so that the charging/discharging current of a signal line can be reduced in comparison with the case of wiring provided on the board, thereby achieving lower power consumption.

In general, in a general-purpose DRAM, the number of metal interconnection layers used is relatively small, i.e., as in a single metal structure using only one layer of metal interconnection, or a double metal structure using two layers of metal interconnection. The small number of metal interconnection layers keeps the height of the DRAM low, and the step formed between the internal interconnection lines small, while helping to prevent the destruction of a fine-fabricated interconnection/element due to the stress caused in the height direction by interlayer insulating film and the like.

On the other hand, as for a logic circuit, a quadruple metal structure or a quintuple metal structure where the number of the metal interconnection layers used are four or five is employed in order to adapt to higher speeds, and the number of metal interconnection layers is on the increase.

Following this increase in the number of metal interconnection layers, in a logic-merged DRAM also the high speed operation of the logic circuit is given high priority, so that a multi-layer metal interconnection is often used for the logic circuit. For the DRAM region, and particularly for the memory cell array of a DRAM, however, the design resource of a conventional general-purpose DRAM is often utilized without making changes so that a control signal line, an internal data line, and the like are often formed with a single metal structure or a double metal structure.

FIG. 28 is a schematic representation of the interconnection structure of a conventional DRAM. In FIG. 28, a memory array is divided into a plurality of memory blocks MBa, MBb, and so on. In memory blocks MBa and MBb, memory cells, not shown, are arranged in a matrix of rows and columns. A main word line MWL is provided extending in the row direction over these memory blocks MBa and MBb. A main word line group MWLS including main word line MWL is formed by a first level aluminum interconnection (1Al) line. Main word lines MWL are coupled to sub word lines at a lower layer not shown via respective sub word drivers SWD.

A sense amplifier circuit and a column select circuit are arranged in the region adjacent to memory blocks MBa and MBb in the column direction. In a sense amplifier band where the sense amplifier circuit and the column select circuit are arranged, a sense amplifier control signal line SCTL for controlling the sense amplifier circuit, a sense power-supply line SPSL for transmitting a power-supply voltage to the sense amplifier circuit, and a sub-decode signal line SDL for transmitting a sub-decode signal for selecting a sub word line are arranged extending in the row direction. A sense amplifier band internal interconnection line group SAIG is formed in the first level aluminum interconnection layer.

On-array internal interconnection line groups ARIGa and ARIGb formed by second level aluminum interconnection (2Al) lines are provided on memory blocks MBa and MBb, respectively. On-array internal interconnection line groups ARIGa and ARIGb include a power-supply line PSL for transmitting a power-supply voltage VCC or a ground voltage. Power-supply line PSL is coupled to sense power-supply line SPSL and strengthens the power supply for the sense amplifier circuit (i.e., limits the variation in the power-supply voltage and the voltage distribution for the sense amplifier circuit).

A driver band internal interconnection line group SWIG extending in the column direction is arranged in a sub word driver band between memory block MBa and memory block MBb. Driver band internal interconnection line group SWIG includes a local subdecode signal line LSDL coupled to subdecode line SDL, and power-supply line PSL for transmitting the power-supply voltage. On-array internal interconnection line groups ARIGa and ARIGb and driver band internal interconnection line group SWIG are all formed in the second level aluminum interconnection layer. The interconnection structure shown in FIG. 28 is a double metal structure using the first level aluminum interconnection (1Al) layer and the second level aluminum interconnection (2Al) layer. When a third level metal interconnection line is used, these upper layer metal interconnection lines are in general all used to strengthen the power-supply lines.

In logic-merged memory 900 shown in FIG. 27, logic 902 can be formed with a multi-layer interconnection structure of three or more layers to achieve a higher speed. Since logic 902 and memory (DRAM) 904 are formed on the same semiconductor chip, the same interconnection structure can be applied for memory (DRAM) 904. Thus, in memory (DRAM) 904, the same multi-layer interconnection structure as logic 902 can be utilized for circuits such as the control circuit, buffer circuit, and data input/output circuit so that peripheral circuitry capable of operating at a high speed can be realized.

The memory array portion is, however, formed making use of the resources of the conventional DRAM, and these multi-layer interconnection structures are not effectively utilized. As the memory cells are increasingly miniaturized, the pitch for a memory cell row and a memory cell column gets smaller. To accommodate such miniaturization, the layout configuration of the direct peripheral circuitry provided within the memory array, such as a sub word driver and a sense amplifier circuit, becomes more complicated. When circuitry having such a complicated layout is provided, unlike the arrangement in which a relatively simple pattern such as a word line is repeated, the accurate photolithography process cannot be performed due to diffused (irregular) reflection and mutual interference, and so on, of energy rays during the exposure step, which leads to the problem of low production yield.

In addition, sense amplifier control signal line SCTL, as shown in FIG. 28, for transmitting a sense amplifier control signal and the like is formed by the first level aluminum interconnection line to which impurities are added in order to bring a greater strength than the second level aluminum interconnection line to the first level aluminum interconnection line. As a result, the electrical characteristic of the first level aluminum interconnection line is degraded from that of the second level aluminum interconnection line. Moreover, in accordance with the miniaturization of the element, the first level aluminum interconnection line has an extremely narrow line width, and when a sense amplifier control signal line SCTL of such an extremely narrow line width is employed, the sense amplifier control signal cannot be transmitted at a high speed to the other end of the memory array. Similar problems arise for main word line MWL when the line width thereof is narrowed according to the memory cell pitch condition in accordance with the miniaturization of the memory cells.

SUMMARY OF THE INVENTION

An object of the present invention is to provide a semiconductor memory device capable of effectively utilizing the multi-layer metal interconnection structure.

Another object of the present invention is to provide a semiconductor memory device capable of a high-speed operation utilizing the multi-layer metal interconnection structure.

A further object of the present invention is to provide a semiconductor memory device having an internal circuit whose layout is simplified by the multi-layer metal interconnection structure.

A still further object of the present invention is to provide a semiconductor memory device, suitable for merging with logic, having a memory array structure capable of effectively utilizing the same multi-layer metal interconnection structure as the multi-layer metal interconnection structure of a logic portion.

According to the first aspect, the semiconductor memory device includes a plurality of memory cells arranged in a matrix of rows and columns, a sense amplifier band at least including a plurality of sense amplifier circuits each provided corresponding to a memory cell column for sensing and amplifying data of a memory cell of a corresponding column when activated, and sense-related circuitry, and a sense-related control signal line for transmitting a control signal to a circuit within the sense amplifier band. The sense-related control signal line includes a first signal line formed in a first interconnection layer and coupled to a corresponding circuit and a second signal line formed in a second interconnection layer above the first interconnection layer and coupled to the first signal line for transmitting a control signal.

According to the second aspect, the semiconductor memory device includes a plurality of memory blocks each including a plurality of memory cells arranged in a matrix of rows and columns and aligned in the row direction, a plurality of sub word lines provided corresponding to respective rows within each memory block and each connected to a memory cell of a corresponding row of a corresponding memory block, a plurality of main word lines provided in common to the plurality of memory blocks and extending in the row direction and each provided corresponding to a prescribed number of rows in each memory block, and a plurality of sub word line drive circuits provided corresponding to the respective sub word lines and each for driving a corresponding sub word line to the selected state according to at least a signal on a corresponding main word line. The plurality of main word lines include conductive lines formed in a layer above the layer in which the transistors and the interconnection lines forming the sub word line drive circuit are formed.

According to the third aspect, the semiconductor memory device includes a conductive layer that receives a predetermined voltage.

According to the fourth aspect, the semiconductor memory device includes a plurality of memory cells arranged in a matrix of rows and columns, a main column select signal transmission line provided along the row direction for transmitting a column select signal for selecting a column of memory cells, and a local column select signal transmission line formed in an interconnection layer below the layer in which the main column select signal transmission line is formed, for receiving the column select signal on the main column select signal transmission line.

According to the fifth aspect, the semiconductor memory device includes a plurality of memory cells arranged in a matrix of rows and columns, a plurality of sense amplifier circuits provided corresponding to a memory cell column for sensing and amplifying data of a memory cell of a corresponding column when activated, a sense power-supply line arranged extending in the row direction, for supplying an operation power-supply voltage to the plurality of sense amplifier circuits, a plurality of column select lines provided extending in,the row direction for transmitting a column select signal for selecting an addressed column from the memory cell columns, and a capacitor provided, below the layer in which the column select lines are formed, overlapping, in plan view, at least partially with the region in which the plurality of column selects lines are arranged, and coupled to the sense-power supply line.

According to the sixth aspect, the semiconductor memory device includes a plurality of memory cells arranged in a matrix of rows and columns, a plurality of sense amplifiers provided corresponding to a memory cell column for sensing and amplifying data of a memory cell of a corresponding column when activated, a sense power-supply line provided extending in the row direction for transmitting an operation power-supply voltage to the plurality of sense amplifiers, a plurality of column select lines arranged extending in the row direction for transmitting a column select signal for selecting an addressed column from the memory cell columns, a sense control line provided extending in the row direction for transmitting a sense control signal for activating a sense amplifier circuit, and a sense amplifier activating element provided in the region, in which the plurality of column select lines are arranged, and activated, in response to the activation of the sense control signal, for coupling the plurality of sense amplifiers to the sense power-supply line. One sense amplifier activating element is provided for a prescribed number of sense amplifiers.

According to the seventh aspect, the semiconductor memory device includes a plurality of memory cells arranged in a matrix of rows and columns, a plurality of column select lines arranged extending in the row direction, for transmitting a write column select signal for selecting an addressed column from memory cell columns in a data write operation, a write data line pair for transmitting write data to a selected memory cell column in a data write operation mode, a bit line pair provided corresponding to a memory cell column, and a plurality of write gate circuits provided corresponding to respective columns for coupling a bit line pair of the selected column to the write data line pair in response to the write column select signal. Each write gate circuit includes a twisted line pair for alternating the positions of a bit line pair of a corresponding column.

According to the eighth aspect, the semiconductor memory device includes a first bit line, a second bit line forming a pair with the first bit line, a first internal interconnection line aligned with the first bit line and coupled to the second bit line, a second internal interconnection line aligned with the second bit line and coupled to the first bit line, a third internal interconnection line aligned with the first internal interconnection line and coupled to the second internal interconnection line, a fourth internal interconnection line aligned with the second internal interconnection line and coupled to the first internal interconnection line, a first write data line provided above the first and second internal interconnection lines and extending in the direction intersecting these first and second internal interconnection lines, a second write data line provided above the third and fourth internal interconnection lines in the direction intersecting these third and fourth internal interconnection lines, a first write gate for coupling the second internal interconnection line to the first write data line in response to a write column select signal and a write instruction signal, and a second write gate for coupling the fourth internal interconnection line to the second write data line in response to the write column select signal and the write instruction signal.

According to the ninth aspect, the semiconductor memory device includes a memory array having a plurality of memory cells arranged in a matrix of rows and columns, a write data line provided extending in the column direction across the memory array for transmitting write data to a selected memory cell, a read data line provided in parallel to the write data line across the memory array for transmitting data read from the selected memory cell of the memory array, and a conductive line provided between the read data line and the write data line for transmitting a prescribed voltage.

By employing a hierarchical structure for the sense-related control lines and column select lines, the sense-related control signals and column select signals can be transmitted at a high speed, allowing a high-speed access.

In addition, a conductive layer on a cell plate electrode layer is fixed to the same voltage as the cell plate electrode layer. When a memory cell capacitor has a stacked structure and the distance is small between the cell plate electrode layer and the conductive layer above the cell plate electrode layer, for instance the first level aluminum interconnection layer, and the two layers short-circuit, no current flows so that the consumed current is reduced. Moreover, even when short-circuiting of the cell plate electrode layer occurs, it can be repaired in effect so that the product yield is improved.

In addition, in a separated IO structure, a twisted structure can be provided to the connections of a bit line pair and a write data line pair within a write gate for performing a write operation, allowing series transistors of the write gate to be arranged in a narrow pitch while simplifying the layout of the write gate.

Moreover, when column select lines are arranged extending in the row direction, a sense amplifier activating transistor or a decoupling capacitor can be provided in the region below without increasing the area.

In addition, in the separated IO structure, a conductive line for transmitting the prescribed voltage is disposed between a write data line and a read data line so that the write data line that full-swings can be prevented from affecting a small amplitude data signal on the read data line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a schematic representation of a cross section of the hierarchical signal line structure shown in FIG. 3.

FIG. 5 is a schematic representation of a word line arrangement of a semiconductor memory device according to the present invention.

FIG. 15 is a schematic representation of a hierarchical column select line arrangement according to a fourth embodiment of the present invention.

FIG. 20 is a diagram representing a modification of the fifth embodiment of the present invention.

FIG. 21 is a schematic representation of the layout of a cross-coupled transistor of a sense amplifier circuit shown in FIG. 16.

FIGS. 22A and 22B are schematic representations of interconnection layout for a write column select gate according to a sixth embodiment of the present invention.

DESCRIPTION OF THE PREFERRED EMBODIMENTS

First Embodiment

Figure 1:
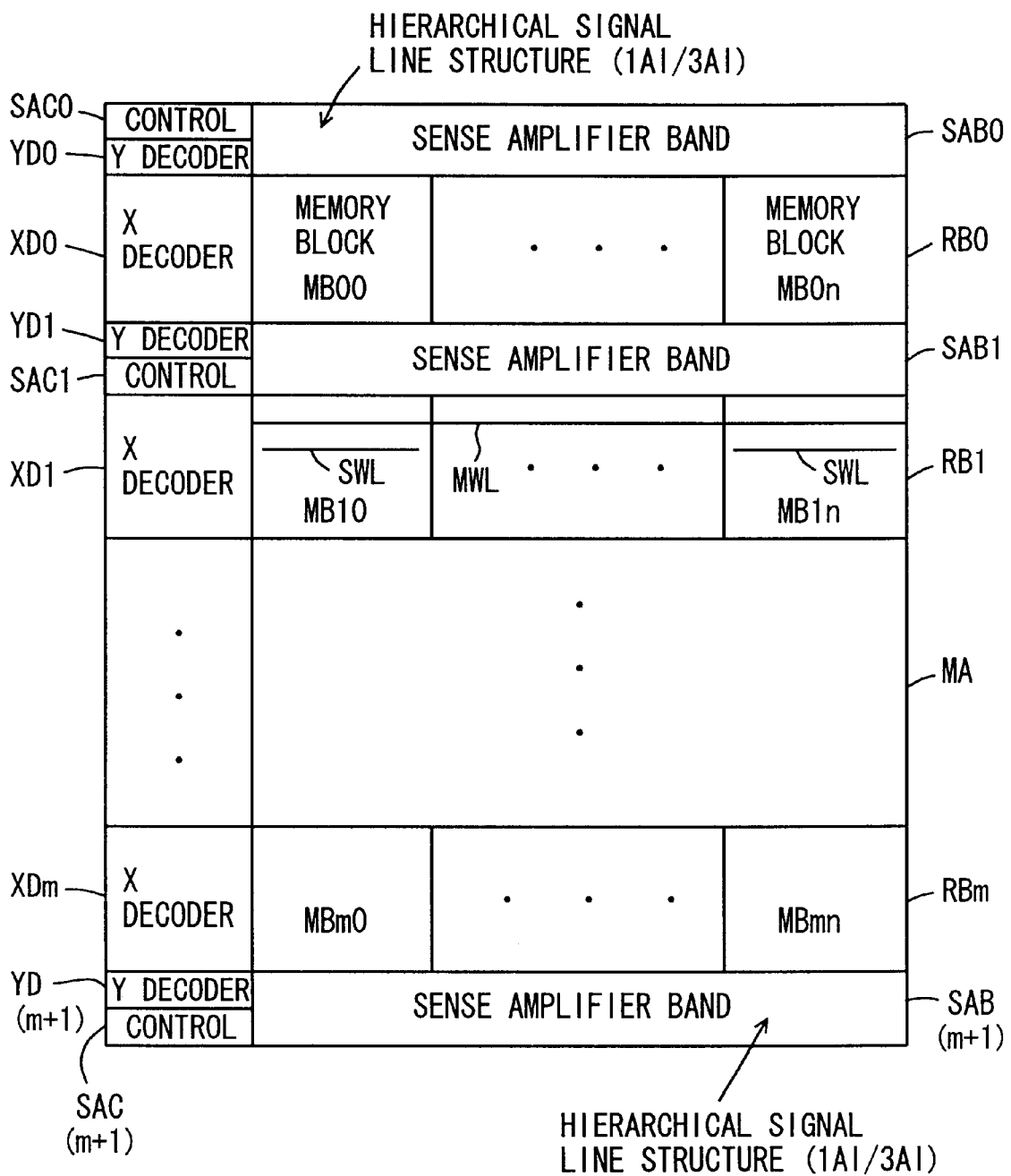
FIG. 1 is a schematic representation of the arrangement of an array portion of a semiconductor memory device according to the present invention.

FIG. 1 is a schematic representation of an arrangement of an array portion of a semiconductor memory device according to the first embodiment of the present invention. In FIG. 1. a memory array MA is divided into a plurality of row blocks RB0 to RBm along the column direction. Each of row blocks RB0 to RBm is divided into a plurality of memory blocks along the row direction. Row block RB0 includes memory blocks MB00 to MB0n, and row block RBm includes memory blocks MBm0 to MBmn. In each of memory blocks MB00 to MBmn, memory cells are arranged in a matrix of rows and columns. Sense amplifier bands SAB1 and so on are arranged between adjacent row blocks, and sense amplifier bands SAB0 and SAB(m+1) are disposed on the outer sides of row blocks RB0 and RBm, respectively. A column select gate for selecting a memory cell column, a bit line isolation gate for isolating a sense amplifier band from a row block, a sense amplifier circuit for sensing and amplifying the memory cell data, and so on are disposed in the sense amplifier bands SAB0 to SAB(m+1).

X decoders XD0 to XDm for driving an addressed row to the selected state are disposed corresponding to row blocks RB0 to RBm, and Y decoders YD0 to YD(m+1) for generating a column select signal for selecting an addressed column are provided corresponding to sense amplifier bands SAB0 to SAB(m+1). Column select lines are disposed extending in the row direction in sense amplifier bands SAB0 to SAB(m+1). As will be described later, internal data lines are arranged extending in the column direction across the memory array, and data of 128 bits, for instance, are transferred at once. Thus, since 128 columns are selected at once, and the number of column select lines is reduced, Y decoders YD0 to YD(m+1) are aligned with X decoders XD0 to XD(m). For sense amplifier bands SAB0 to SAB (m+1), sense-related control circuits SAC0 to SAC(m+1) for controlling a circuit/gate included in a corresponding sense amplifier band are provided.

In the first embodiment of the present invention, signal lines included in sense amplifier bands SAB0 to SAB(m+1) have a hierarchical structure. In other words, a signal is transmitted using the third level aluminum interconnection, while a signal line actually connected to a transistor is formed by the first level aluminum interconnection (1Al) line. Thus, in sense amplifier band SAB (SAB0 to SAB(m+1)), the low resistance third level aluminum interconnection (3Al) layer having a good electrical characteristic is employed to transmit a signal from one side to the other side of memory array MA in the row direction. Transmission of a signal to each transistor via the lower first level aluminum interconnection line from the third level aluminum interconnection line allows a high-speed signal transmission without the rounding of the signal waveform, and achieves a high-speed operation.

Figure 2:
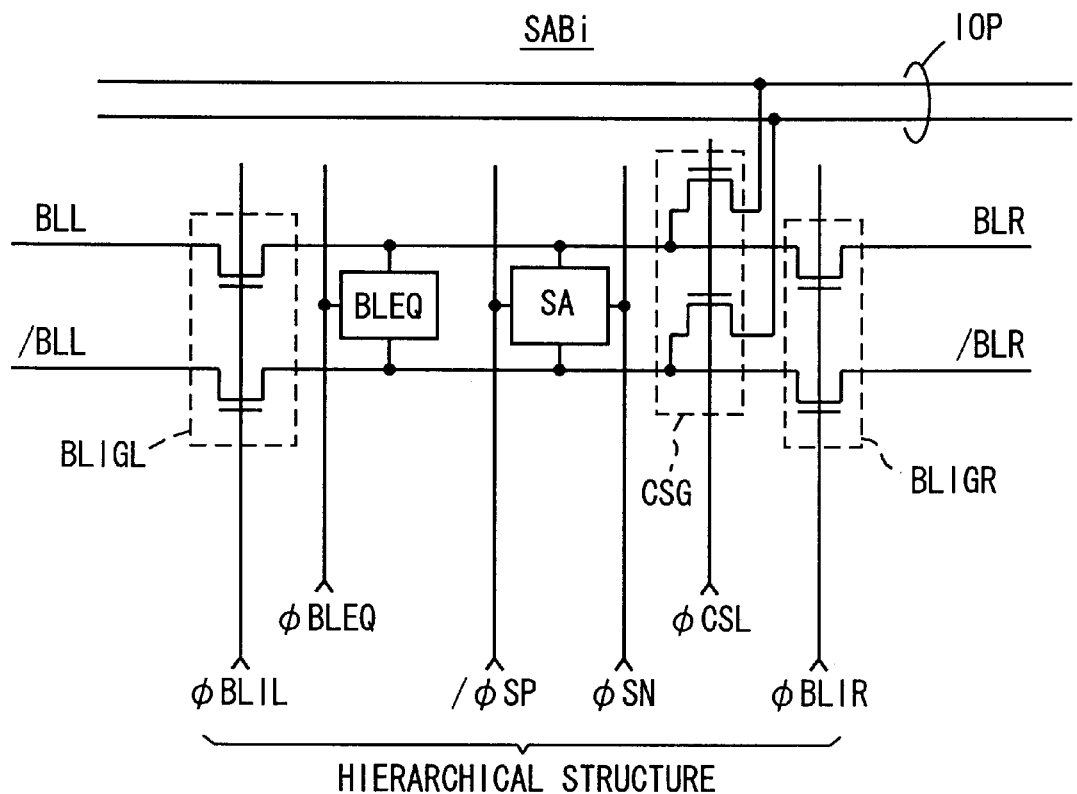
FIG. 2 is a schematic representation of the arrangement of the main portion of the semiconductor memory device according to a first embodiment of the present invention.

FIG. 2 is a schematic representation of the arrangement of a portion related to one sense amplifier circuit SA in one sense amplifier band SABi. In FIG. 2, sense amplifier circuit SA is provided for bit line pair BLL and /BLL and bit line pair BLR and /BLR included in the corresponding memory blocks of adjacent row blocks. Sense amplifier circuit SA is shared by two memory blocks.

Bit line pair BLL and /BLL is connected to sense amplifier circuit SA via a bit line isolation gate BLIGL rendered conductive in response to a bit line isolation instruction signal φBLIL. Bit line pair BLR and /BLR is connected to sense amplifier circuit SA via a bit line isolation gate BLIGR rendered conductive in response to bit line isolation instruction signal φBLIR. A bit line equalizing circuit BLEQ for precharging these bit line pairs BLL, /BLL and BLR, /BLR to a prescribed voltage (intermediate voltage) level in response to a bit line equalizing instruction signal φBLEQ is provided adjacent to sense amplifier circuit SA. Moreover, sense amplifier circuit SA is coupled to an internal data line pair IOP via a column select gate CSG selectively rendered conductive in response to a column select signal φCSL. The signal lines arranged in these sense amplifier bands (referred to as sense-related signal lines) are all formed in the hierarchical structure.

Figure 3:
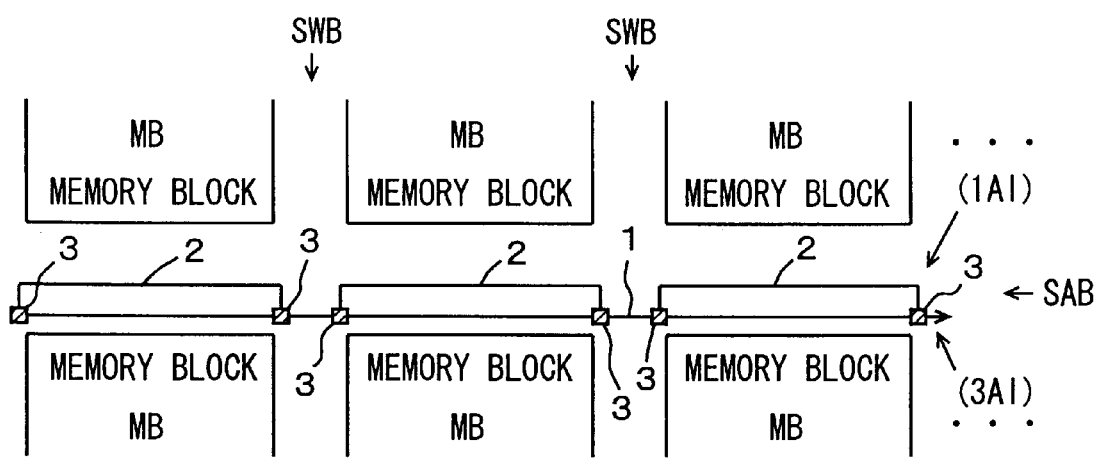
FIG. 3 is a schematic representation of a hierarchical signal line structure according to the first embodiment of the present invention.

FIG. 3 is a schematic representation of the interconnection arrangement for one signal in one sense amplifier band SAB. As shown in FIG. 3, a main sense-related signal line 1 formed at the third level aluminum interconnection layer is provided in sense amplifier band SAB in common to memory blocks MB included in the row blocks on either side of sense amplifier band SAB. Sub sense-related signal lines 2 are provided corresponding to the respective memory blocks MB. These sub sense-related signal lines 2 are provided only to memory blocks MB on either side of sense amplifier band SAB.

A sub word driver band SWB for disposition of a sub word driver for driving a sub word line to the selected state is provided between memory blocks MB adjacent to one another in the row direction. The first level aluminum interconnection (1Al) line is not provided in sub word driver band SWB. A sub sense-related signal line 2 is not provided in the region (the cross band) where sub word driver band SWB and sense amplifier band SAB intersect with each other so as to allow other circuits to be disposed. Sub sense-related signal lines 2 is coupled to main sense-related signal line 1 via a contact 3.

The third level aluminum interconnection layer is a metal interconnection layer at an upper layer, and its purity is higher than the purity of the first level metal (aluminum) interconnection layer, and has a good electrical characteristic so that a signal can be transmitted at a high speed from one end to the other end of the memory array. Thus, each sub sense-related signal lines 2 can transmit a signal at a high speed according to the signal on main sense-related signal line 1. Sense-related signals include signals φBLIL, φBLEQ, /φSP, φSN, φCSL, and φBLIR. Sense-related signals are coupled to a gate or a circuit in the region facing memory block MB in sense amplifier band SAB. Thus, no problem arises even when a sub sense-related signal line is not used in this cross band region, and for instance, a sense amplifier activating transistor and the like can easily be provided in this cross band region, and the transistors of other circuits can be increased in size.

FIG. 4 is a schematic representation of the structure of the sense-related signal lines. In FIG. 4, a bit line isolation instruction signal φBLI is shown as a representative example of the sense-related signals.

In FIG. 4, the sense-related signal lines are formed at the third level aluminum interconnection layer, and include a main sense-related signal line 1 arranged extending along one direction in a sense amplifier band and a sub sense-related signal line 2 provided in parallel to main sense-related signal line 1 and disposed extending only within a sense amplifier group region SGR. Sense amplifier group region SGR is the region in which sense amplifier circuit SA is disposed and which faces memory block MB. Sub sense-related signal line 2 is connected via a first through hole 3a to an intermediate interconnection line 4 formed by the second level aluminum interconnection (2Al) line in the vicinity of the boundary region between a cross band CR and sense amplifier group region SGR. Intermediate interconnection line 4 is connected via a second through hole 3b to a main sense-related signal line 1. Since the third level aluminum interconnection line and the first level aluminum interconnection line are distanced, intermediate interconnection line 4 is employed in order to ensure the contact between the third level aluminum interconnection line and the first level aluminum interconnection line by reducing the aspect ratios of through holes 3a and 3b.

Main sense-related signal line 1 has a line resistance, r, and sub sense-related signal line 2 has a line resistance, R. Line resistance, r, of main sense-related signal line 1 is sufficiently small so that bit line isolation instruction signal φBLI is transmitted at a high speed from one end to the other end of the memory array. Sub sense-related signal line 2 has its both ends connected to main sense-related signal line 1 via through holes 3a and 3b. Thus, bit line isolation instruction signal φBLI is transmitted from both sides in sub sense-related signal line 2 so that bit line isolation instruction signal φBLI is driven to the definite state at a high speed within sense amplifier group region SGR even when line resistance R is relatively large.

Moreover, sub sense-related signal line 2 is formed by the first level aluminum interconnection line, and an MOS transistor (in FIG. 2 or an MOS transistor of a circuit component) formed in a field region has a gate electrode formed at a first level polysilicon layer. Sub sense-related signal line 2 is electrically connected to the gates of these MOS transistors in a region not shown. In this case, as in the so-called word line shunt structure, a sub sense-related signal line and a gate of an MOS transistor of a bit line isolation gate can be formed to have a hierarchical structure (shunt structure). The same is true for a transistor included in a bit line precharging/equalizing circuit BLEQ.

In addition, in the above-described arrangement, sub sense-related signal line 2 is divided on a memory block basis. Like main sense-related signal line 1, sub sense-related signal line 2, however, may be disposed extending continuously from one end to the other end of memory array in the sense amplifier band. Thus, sub sense-related control signal line 2 may be provided in cross band CR.

As seen from the above, according to the first embodiment of the present invention, signal lines arranged in a sense amplifier band have a hierarchical structure so that a signal can be transmitted from one end to the other end of the memory array at a high speed. In addition, when a third level aluminum interconnection line is employed, for instance, the sense-related signal lines can be formed with the hierarchical structure without affecting the interconnection lines in the lower layers.

Furthermore, sub sense-related signal lines are disposed such that they extend only within the sense amplifier group regions, so that a component of other circuits (for instance, a sub word line driver) can be easily arranged in the cross band while the component size can be increased.

Second Embodiment

FIG. 5 is a schematic representation of the arrangement of a sub word driver. A sub word line SWL is disposed in a memory block MB, and one main word line ZMWL is arranged for the four adjacent sub word lines in each of memory blocks MBa to MBc. In a sub word driver band SWB (SWBa, SWBb), one sub word driver SWD drives sub word lines of two memory blocks adjacent to one another in the row direction. Sub decode signals SD0 to SD3 are transmitted via sub decode signal line group SDLG extending in the row direction, to select one sub word line from a set of four sub word lines SWL0 to SWL3. Sub decode signals SD0 to SD3 are transmitted in the column direction along the respective memory blocks by buffer circuits not shown in the sub word driver band. Since the pitch of sub word lines SWL is reduced, one sub word driver SWD is provided for two sub word lines. One sub word driver SWD drives the sub word lines of two memory blocks at the same time. More specifically, in FIG. 5, sub decode signals SD0 and SD2 are transmitted in sub word driver band SWBa and respectively designates sub word lines SWL0 and SWL2 included in memory blocks MBa and MBb. On the other hand, sub decode signals SD1 and SD3 are transmitted in sub word driver band SWBb by a buffer circuit not shown, and respectively designates sub word lines SWL1 and SWL3 included in memory blocks MBb and MBc. The pitch condition of sub word driver SWD can be mitigated by disposing sub word drivers SWD alternately in sub word driver bands SWB.

Figure 6:
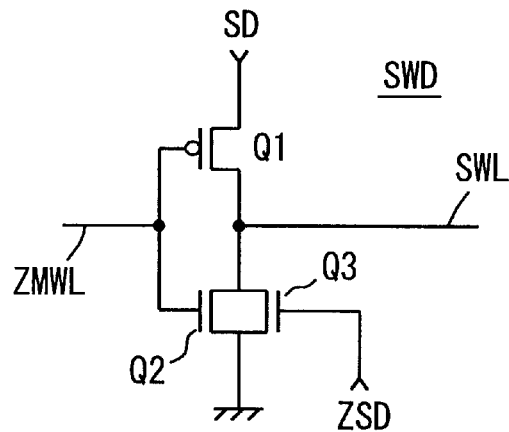
FIG. 6 is a diagram showing an arrangement of a sub word driver shown in FIG. 5.

FIG. 6 is a diagram representing the arrangement of sub word driver SWD. In FIG. 6, sub word driver SWD includes a P-channel MOS transistor Q1 rendered conductive, in response to a signal on a main word line ZMWL, for transmitting a sub decode signal SD to a sub word line SWL, an N-channel MOS transistor Q2 rendered conductive, in response to the signal on main word line ZMWL, for discharging sub word line SWL to a ground voltage level, and an N-channel MOS transistor Q3 rendered conductive in response to a complementary sub decode signal ZSD, for discharging sub word line SWL to the ground voltage level.

Sub decode signal SD changes between a high voltage VPP and a ground voltage GND. Main word line ZMWL also changes between high voltage VPP and ground voltage GND or a negative voltage. When main word line ZMWL in the selected state attains the logic low or L level, and if sub decode signal SD is at the logic high or H level, P-channel MOS transistor Q1 is rendered conductive and sub word line SWL is driven to high voltage VPP level according to sub decode signal SD. At this time, complementary sub decode signal ZSD is at the L level, and MOS transistors Q2 and Q3 are in the off state. On the other hand, when main word line ZMWL is in the selected state or at the L level, and sub decode signal SD is at the L level, P-channel MOS transistor Q1 enters the off state. At this time, MOS transistor Q2 is also in the off state. In order to prevent sub word line SWL from entering the electrically floating state, complementary sub decode signal ZSD at H level causes MOS transistor Q3 to enter the on state, maintaining sub word line SWL at the ground voltage level.

When main word line ZMWL is in the unselected state or at high voltage VPP level, P-channel MOS transistor Q1 is in the off state regardless of the logic level of sub decode signal SD, and sub word line SWL is discharged to the ground voltage level at least via N-channel MOS transistor Q2.

Now, the case is considered in which a sub word driver is formed with a double metal structure. In the double metal structure, main word line ZMWL is formed by the first level aluminum interconnection line.

Figure 7:
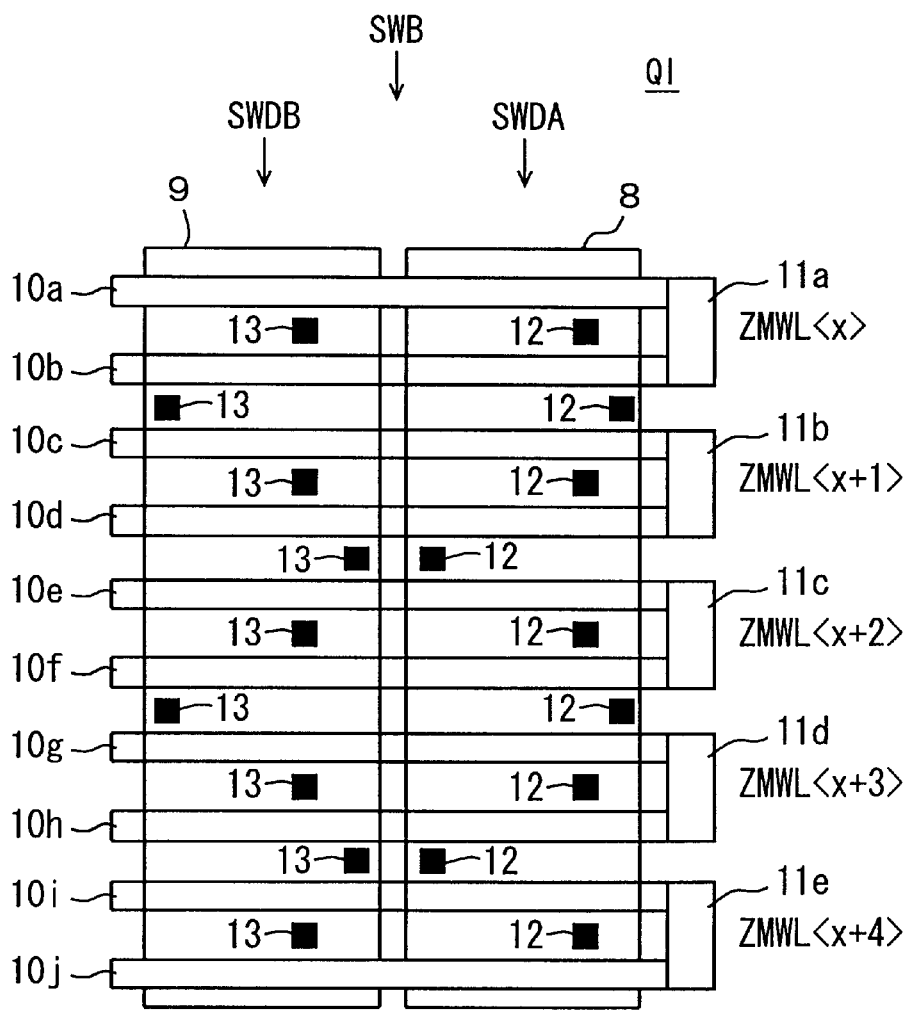
FIG. 7 is a schematic representation of the layout for an MOS transistor of the sub word driver shown in FIG. 6.

As shown in FIG. 7, for simplicity of description, the arrangement is considered of P-channel MOS transistor Q1 of sub word drivers SWDA and SWDB receiving a pair of sub decode signals SD<a> and SD<b> in a sub word driver band SWB. A P-channel MOS transistor Q1 of sub word driver SWDA is formed in a field region 8, and a P-channel MOS transistor Q1 of sub word driver SWDB is formed in a field region 9. In sub word driver band SWB, a driver for driving two sub word lines SWL is provided for one main word line ZMWL. Thus, first level polysilicon interconnection lines 10a to 10j forming the gates of P-channel MOS transistors Q1 in field regions 8 and 9 are interconnected in pairs by first level polysilicon interconnection lines 11a to 11e, respectively. Interconnection lines 11a to 11e correspond to main word lines ZMWL<X> to ZMWL<X+4>, respectively.

A bit contact 12 for receiving a sub decode signal SD<a> is arranged in field region 8, and a bit contact 13 for receiving a sub decode signal SD <b> is disposed in field region 9. The arrangement patterns for bit contacts 12 and 13 are offset by pitches of two gates of P-channel MOS transistors. Bit contacts are disposed on either side in the respective field regions 8 and 9 so as to transmit a sub decode signal to a corresponding sub word line via two bit contacts (the gate width of the transistors is equivalently doubled). A drain node of a P-channel MOS transistor Q1 of the sub word driver must be provided to a corresponding sub word line SWL.

Figure 8A:
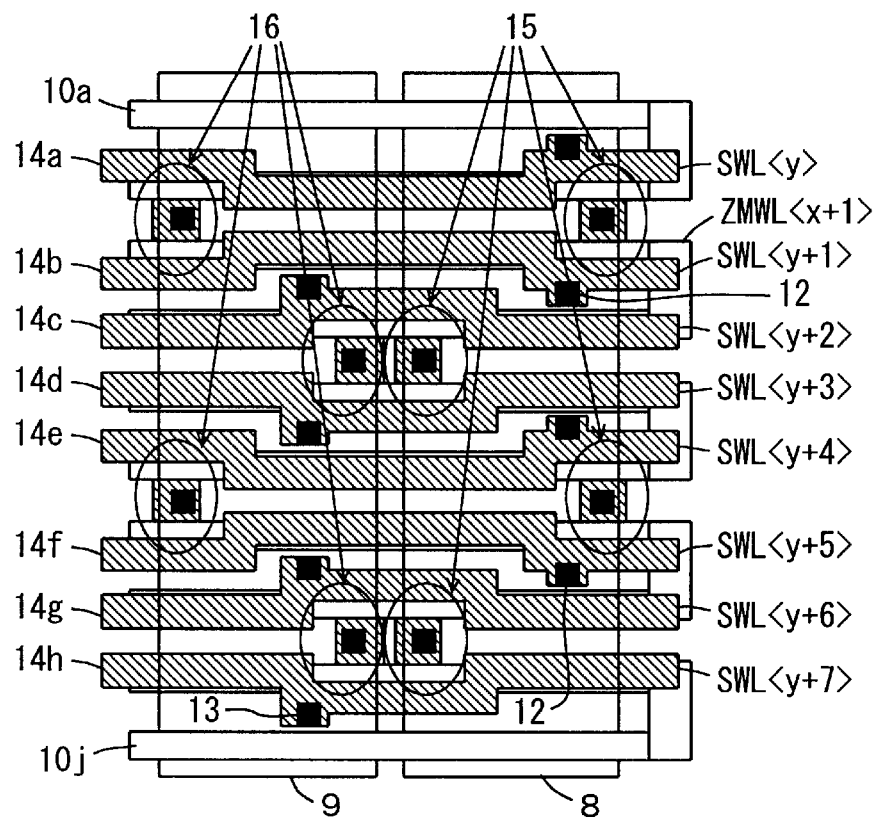
FIGS. 8A and 8B are schematic representations of interconnection layout for a P-channel MOS transistor of the sub word driver shown in FIG. 6.

FIG. 8A is a diagram showing the arranged sub word lines. In FIG. 8A, second level polysilicon interconnection lines 14a to 14h are arranged in the same layer as the bit lines in parallel on the gate electrode layer of these P-channel MOS transistors. These bit-line-common layer interconnection lines 14a to 14h correspond to sub word lines SWL<y> to SWL<y+7>. Two bit-line-common layer interconnection lines adjacent to one another are connected to field regions 8 and 9 via contacts 12 and 13, respectively. A contact between adjacent contacts of the contacts connected to the bit-line-common layer interconnection lines is further connected to an intermediate bit-line-common layer interconnection line to receive a sub decode signal. Contacts 12 and 13 not connected to bit-line-common layer interconnection lines 14a to 14h form sub decode signal nodes 15 and 16, respectively.

Due to the need to form contacts (regions of nodes 15 and 16) for receiving sub decode signals, the bit-line-common layer interconnection lines forming the sub word lines cannot be disposed in a straight line, and are arranged in L-shape in the vicinity of the contacts in order to set aside the contact regions.

In the layout of the sub word lines shown in FIG. 8A, when main word line ZMWL<X+1> is selected, sub word lines SWL<y+1> and SWL<y+2> are driven to the selected state according to the voltage levels of the signals at nodes 15 and 16. For instance, when sub word line SWL<y+1> is selected, sub decode signals (high voltage) are applied to sub word line SWL<y+1> from sub decode signal nodes 15 on either side of contact 12 connected to sub word line SWL<y+1>. Sub word lines SWL<y> to SWL<y+7> are each connected to gates of transistors of the memory cells in a corresponding row of the memory blocks on either side.

Figure 8B:
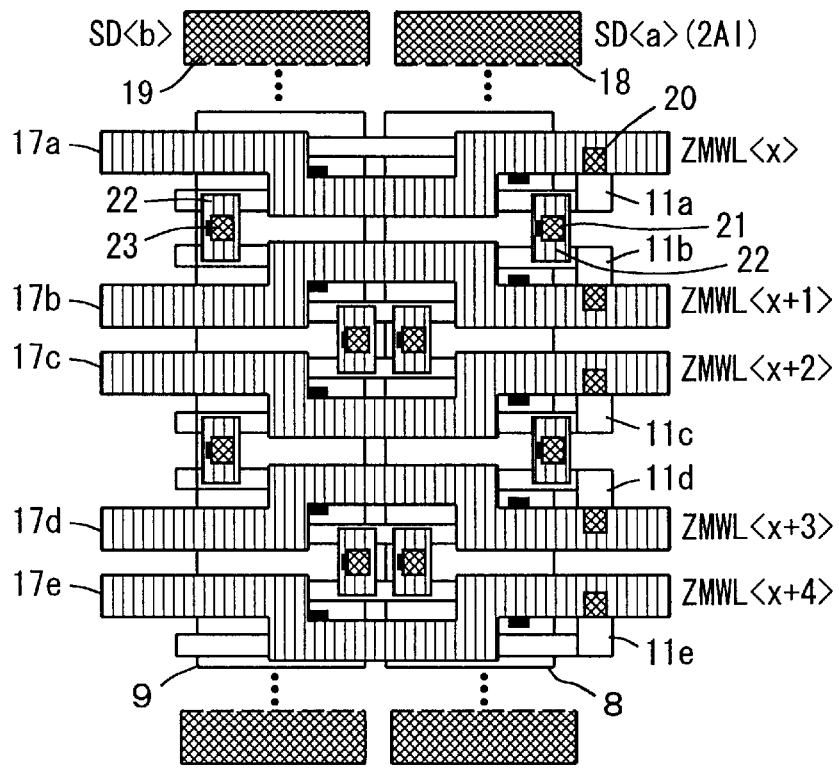

Thereafter, as shown in FIG. 8B, main word lines are arranged using the first level aluminum interconnection lines. Main word lines ZMWL<X> to ZMWL<X+4> are provided by first level aluminum interconnection lines 17a to 17e. First level aluminum interconnection lines 17a to 17e forming the main word lines are connected to connecting lines 11a to 11e in a lower layer via through holes 20.

In addition, when providing the main word lines, sub decode signal nodes 15 and 16 shown in FIG. 8A are connected to the sub decode signal transmission lines through a first level aluminum interconnection line 22 of an intermediate layer on these sub decode signal nodes 15 and 16. Second level aluminum interconnection lines 18 and 19 for transmitting sub decode signals SD<a> and SD<b> are provided in the direction intersecting a main word line. Second level aluminum interconnection line 18 is connected via a through hole 21 to sub decode signal node 15, and second level aluminum interconnection line 19 is coupled to sub decode signal node 16 via a through hole 23.

First level aluminum interconnection line 22 at an intermediate layer must be formed in order to connect sub decode signal nodes 15 and 16 to second level aluminum interconnection lines 18 and 19 forming the sub decode signal lines so that first level aluminum interconnection lines 17a to 17e forming the main word lines are provided in the lateral U-shape in the vicinities of the contacts for sub decode signal lines.

With a layout employing such U-shape, when memory cells are miniaturized and the pitch for the sub word lines is reduced, it becomes difficult to effect patterning in a photolithography step with accuracy (due to the mask misalignment, diffused reflection of the exposure light and the like). Therefore, the arrangement of the main word lines becomes complicated when the sub word drivers are formed in the double metal structure, which results in the reduction of yield. Thus, the main word lines are formed by a metal interconnection line (for example, a third level aluminum interconnection line) at a layer above the layer in which sub decode signal lines are formed.

Figure 9:
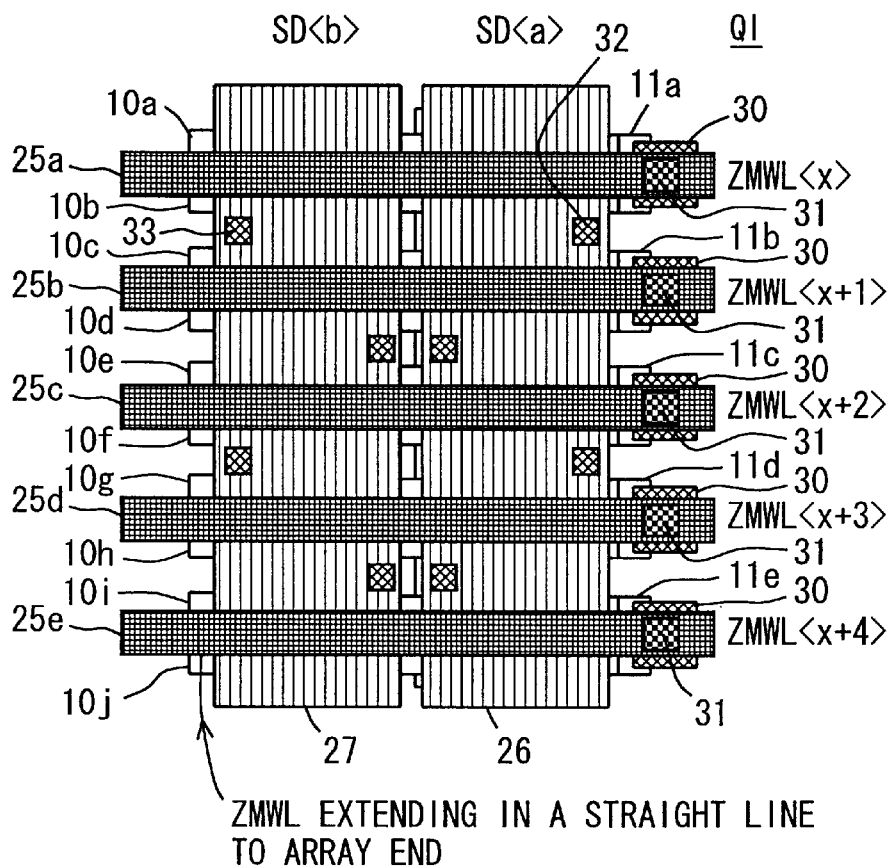
FIG. 9 is a schematic representation of an interconnection layout for a sub word driver according to a second embodiment of the present invention.

FIG. 9 is a diagram illustrating the arrangement of a sub word driver according to the second embodiment of the present invention. FIG. 9 shows the layout of the portion of a P-channel MOS transistor Q1 of the sub word driver. In FIG. 9, first level polysilicon interconnection lines 10a to 10j, forming the gate electrodes of the P-channel MOS transistor are arranged in the same layout as FIG. 7. First level aluminum interconnection lines 26 and 27 transmitting sub decode signals SD<a> and SD<b> respectively are provided in the direction intersecting gate electrode interconnection lines 10a to 10j,. First level aluminum interconnection line 26 is connected to a source node (field region) of P-channel MOS transistor Q1 via a contact hole 32 and via a first level aluminum interconnection line in a lower layer. In addition, first level polysilicon interconnection line 27 is electrically connected to a lower field region via a contact hole 33. Contact holes 32 are alternately disposed on either side of first level polysilicon interconnection line 26, with each contact hole 32 provided for the gates of two transistors. Contact holes 33 are provided in the similar manner.

Gate electrode interconnection lines of two MOS transistors are connected via each of connecting lines (first level polysilicon interconnection lines) 11a to 11e. Third level aluminum interconnection lines 25a to 25e forming main word lines ZMWL<X> to ZMWL<X+1> respectively are provided extending in straight lines in the row direction in parallel to transistor gate electrode interconnection lines 10a to 10j,. Each of these third level aluminum interconnection lines 25a to 25e is connected via a through hole 31 to a second level aluminum interconnection 30 forming a lower intermediate layer. Second level aluminum interconnection 30 is further connected to connecting lines 11a to 11e via an intermediate layer not shown.

As shown in FIG. 9, first level aluminum interconnection lines 26 and 27 form the signal lines transmitting sub decode signals SD<a> and SD<b>, and third level aluminum interconnection lines 25a to 25e formed main word lines ZMWL<X> to ZMWL<X+4> respectively. A sub decode signal node for transmitting a sub decode signal to a source of a sub word line driving MOS transistor Q1 can be formed in a layer below the layer in which a main word line is formed. Therefore, there is no need to arrange the main word line avoiding the sub decode signal node so that the main word line can be provided in a straight line from one end to the other end of the memory array, which simplifies the layout. In addition, the interconnection pattern is also simplified so that accurate patterning can be effected in the photolithography step, resulting in improved product yield. Moreover, the main word lines are provided in straight lines, and third level aluminum interconnection line is utilized for the main word lines so that a word line selecting signal can be transmitted at a high speed to the end of the memory array.

Figure 10:
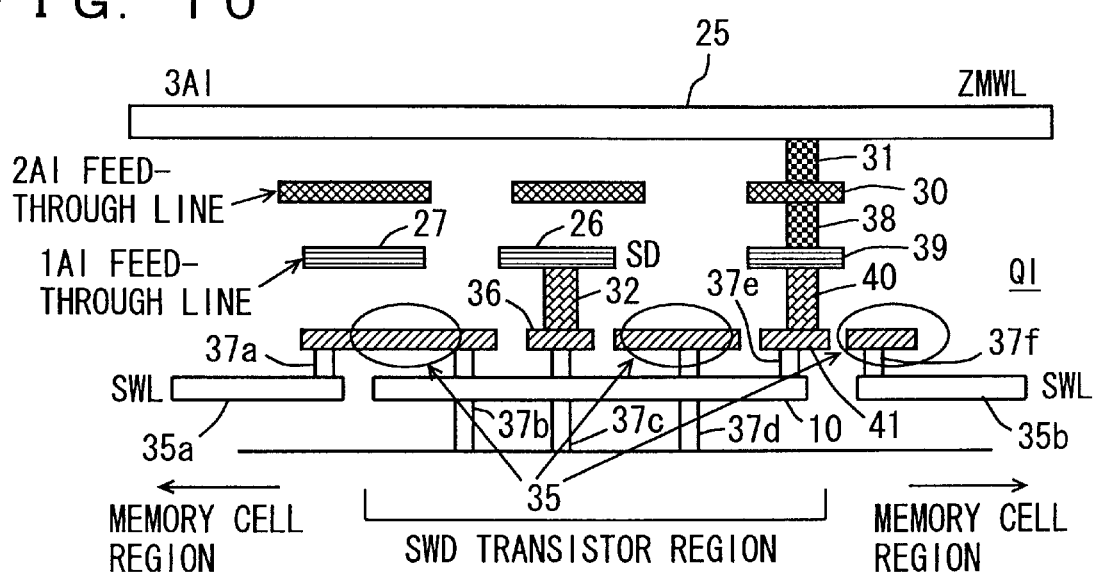
FIG. 10 is a schematic representation of a cross section of the structure of the sub word driver shown in FIG. 9.

FIG. 10 is a diagram representing the structure of a cross section of a portion of a P-channel MOS transistor in a sub word driver (SWD). In FIG. 10, a P-channel MOS transistor Q1 of the sub word driver (SWD) is arranged within the transistor region. This MOS transistor Q includes a gate electrode interconnection line 10 formed at the first level polysilicon interconnection line. Moreover, first level polysilicon interconnection lines 35a and 35b forming sub word lines SWL are formed within the memory cell regions. These memory cell regions correspond to the regions of the memory blocks on either side of the sub word driver band.

A bit-line-common layer interconnection line 35 forming a sub word line node for connecting a sub word line with a sub word driver transistor is formed in a layer above the first level polysilicon interconnection layer. Bit-line-common layer interconnection lines 35 are electrically connected to the regions forming the drains of MOS transistors Q1 via bit contacts 37b and 37d, respectively. On, the other hand, a bit-line-common layer interconnection line 36 for supplying a sub decode signal to a source of an MOS transistor is provided between interconnection lines 35 forming the sub word line nodes. Bit-line-common layer interconnection line 36 is electrically connected via a bit contact 37c to a region within the transistor region to which bit contacts 37b and 37d are connected and to the regions opposing with respect to gate electrode interconnection line 10. Bit-line-common layer interconnection line 36 is connected via a contact hole 32 to first level aluminum interconnection line 26 for transmitting sub decode signal SD (SD<a>). A first level aluminum interconnection line 27 for transmitting the other sub decode signal is provided in parallel to first level aluminum interconnection line 26. First level aluminum interconnection line 27 serves as a feed-through line and is not connected to the MOS transistor.

Sub word line nodes 35 are connected to first level polysilicon interconnection lines 35a and 35b forming sub word lines SWL via bit contacts 37a and 37f, respectively. Gate electrode interconnection line 10 is connected to a bit-line-common layer interconnection line 41 forming an intermediate layer via a bit contact. Bit-line-common layer interconnection line 41 is connected to a first level aluminum interconnection line 39 via a contact 40. First level aluminum interconnection line 39 is connected via a through hole 38 to a second level aluminum interconnection line 30 which in turn is connected via a through hole 31 to a third level aluminum interconnection line 25 forming a main word line.

As shown in FIG. 10, second level aluminum interconnection lines are provided as feed-through lines. Although interconnection lines 35 for sub word line nodes must be provided such that bit-line-common layer interconnection lines 36 and 41 forming the intermediate layer for the contacts are avoided, a sub decode signal SD is transmitted via the first level aluminum interconnection line so that, in comparison with the arrangement of FIG. 8 in which sub decode signal SD is transmitted via the second level aluminum interconnection line, the area occupied by the contact region can be reduced (since the aspect ratio becomes smaller). Thus, the degree of the bending of bit-line-common layer interconnection lines forming sub word line nodes required to form the sub decode signal nodes can be made small, and the layout can be simplified.

Further, in a sub word driver, the layout of an N-channel MOS transistor having its gate connected to a main word line is similar to the layout of the P-channel MOS transistor. The N-channel MOS transistor receives a ground voltage in place of a sub decode signal. In the layout of an N-channel MOS transistor that receives a complementary sub decode signal at a gate, a different first level aluminum interconnection line is employed to couple complementary sub decode signal ZSD to a gate electrode layer of the MOS transistor (sub decode signals SD and ZSD have different amplitudes). The ground voltage is transmitted using the second level aluminum interconnection line and is connected to a source of an N-channel MOS transistor in the sub word driver.

As described above, according to the second embodiment, the main word lines are formed by the interconnection line in a layer above the layer in which signal lines for transmitting sub decode signals are formed, and the main word lines can be provided straightly extending to the array end portion. Consequently, a word line selecting signal can be transmitted at a high speed and the layout pattern for the main word lines can be simplified, while the main word lines can be patterned with accuracy even in a fine fabrication. Moreover, the layout for a sub word driver can be simplified so that accurate patterning can be effected and improved yield can be achieved.

Third Embodiment

Figure 11:
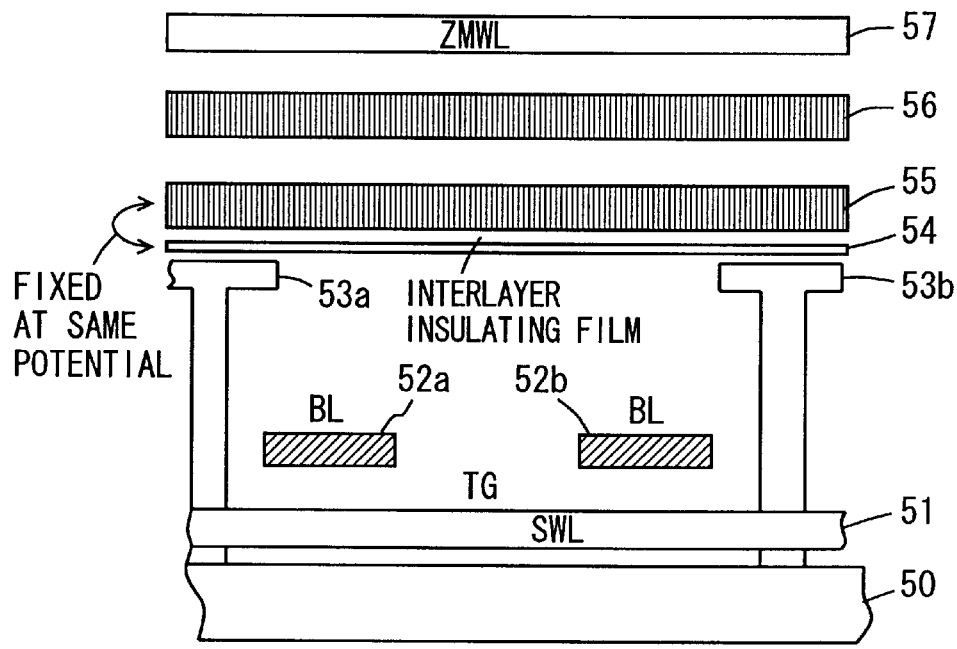
FIG. 11 is a schematic representation of the arrangement of the main portion of a semiconductor memory device according to a third embodiment of the present invention.

FIG. 11 is a schematic representation of the arrangement of the main portion of the third embodiment of the present invention. In FIG. 11, a first level polysilicon interconnection line (TG) 51 is provided on a semiconductor substrate region 50. First level polysilicon interconnection line 51 becomes a sub word line SWL and forms a gate of an access transistor included in a memory cell. Above first level polysilicon interconnection line 51, second level polysilicon interconnection lines 52a and 52b forming bit lines BL are provided in the direction intersecting first level polysilicon interconnection line 51. Third level polysilicon interconnection lines 53a and 53b connected to the storage nodes of memory cells are formed above interconnection lines 52a and 52b forming bit lines BL. Third level polysilicon interconnection lines 53a and 53b serve as storage nodes of capacitors of memory cells.

A fourth level polysilicon interconnection layer 54 forming a cell plate electrode layer is provided on third level polysilicon interconnection lines 53a and 53b with a capacitor insulating film provided therebetween. Fourth level polysilicon interconnection layer 54 forming the cell plate electrode layer is provided with a prescribed cell plate voltage (intermediate voltage VCCS/2). A first level aluminum interconnection layer 55 is provided on fourth level polysilicon interconnection layer 54 with an interlayer insulating film, not shown, provided therebetween. A second level aluminum interconnection line 56 is provided on first level aluminum interconnection layer 55.

As the area for a memory cell is miniaturized, interconnection lines 53a and 53b serving as storage nodes are normally provided such that they extend over sub word line SWL so that the facing area between the storage node and the cell plate electrode becomes sufficiently large in order to ensure the capacitance of the capacitor. As a result, the height of the storage nodes becomes high, and the location of fourth level polysilicon interconnection layer 54 serving as the cell plate accordingly becomes high so that the spacing between fourth level polysilicon interconnection layer 54 and first level aluminum interconnection layer 55 becomes extremely narrow.

The cell plate electrode layer formed by the fourth level polysilicon interconnection layer has an uneven surface, and this unevenness often causes first level aluminum interconnection layer 55 in the upper layer to short-circuit with the fourth level polysilicon interconnection layer 54 forming the cell plate electrode. Thus, first level aluminum interconnection layer 55 is fixed to the same potential as fourth level polysilicon interconnection layer 54 forming the cell plate electrode and is used as a dummy conductive layer so as to prevent the flow of current even when short-circuiting occurs between interconnection layer 55 and interconnection layer 54.

In a general-purpose DRAM, this first level aluminum interconnection layer 55 is often used as the main word lines. According to the present invention, however, as described in relation to the previous second embodiment, main word line ZMWL is formed by a third level aluminum interconnection layer 57. As a result, no malfunction occurs even when first level aluminum interconnection layer 55 and fourth level polysilicon interconnection layer 54 short-circuit so that the DRAM operates in a stable manner.

Figure 12:
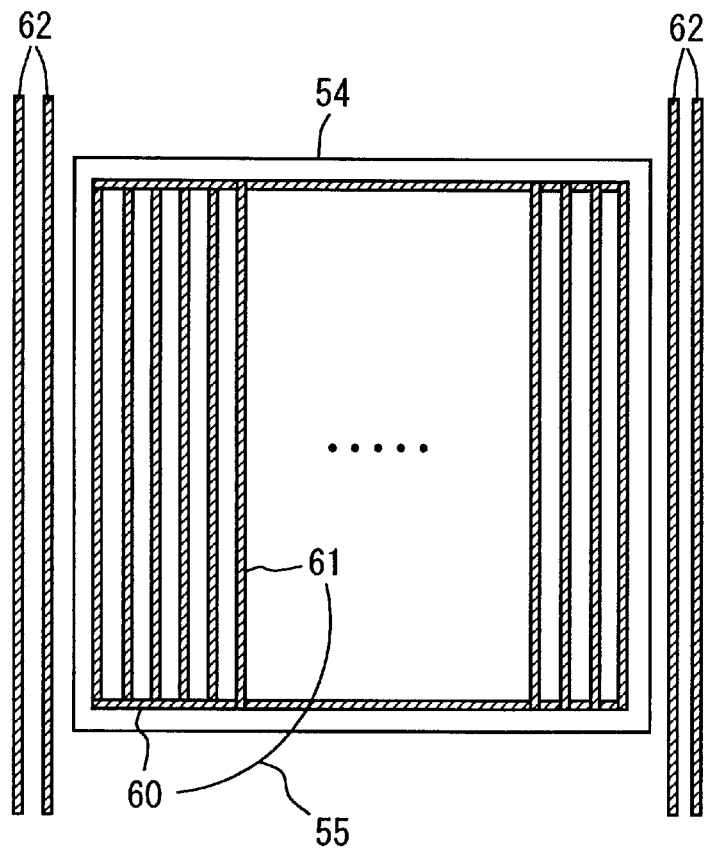
FIG. 12 is a schematic representation of the structure of a cell plate electrode layer and a metal interconnection layer directly above the cell plate electrode layer shown in FIG. 11.

FIG. 12 is a schematic representation of the arrangement of a first level aluminum interconnection line on the cell plate electrode layer. In FIG. 12, a cell plate electrode 54 is provided extending over the memory block. Conductive lines 61 having a relatively narrow line width are arranged on cell plate electrode 54 at a prescribed pitch. An end interconnection line 60 is disposed interconnection conductive lines 61 in the cell plate end portion. End interconnection line 60 and conductive lines 61 are of the first level aluminum interconnection layer. Dummy interconnection lines 62, also of the first level aluminum interconnection layer and of the same pattern as conductive lines 61, are provided outside cell plate electrode 54. By providing dummy interconnection lines 62, conductive lines 61 are accurately patterned on cell plate electrode 54. By arranging the lines/spaces in a regular manner, accurate patterning can be effected in a photolithography step. In addition, by providing the lines/spaces at a constant pitch, the elevation of the central portion can be prevented during the chemical mechanical polishing (CMP) performed in the etching step, and the dummy aluminum interconnection lines for preventing the short-circuiting of cell plate electrode 54 can be provided without adversely affecting the interconnection lines in other layers. If conductive lines 61 are laid out extending in the row direction at the same pitch as the main word lines, the conductive lines can be patterned using the mask for patterning the main word lines of a general-purpose DRAM.

Figure 13:
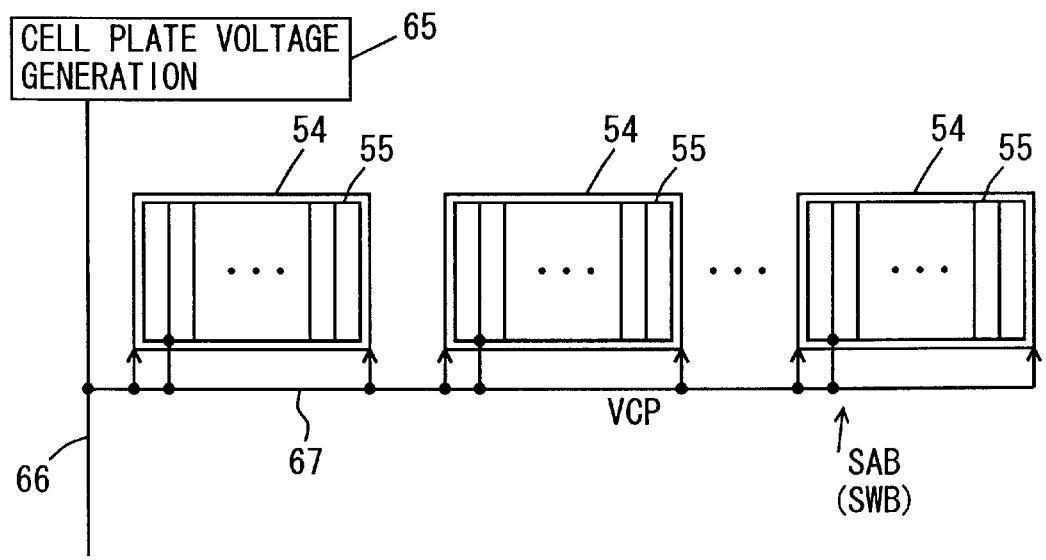
FIG. 13 is a schematic representation of the arrangement for voltage application according to the third embodiment of the present invention.

FIG. 13 is a diagram representing an example of the manner in which a cell plate voltage VCP is applied to cell plate electrode 54 and to a dummy aluminum interconnection layer 55. In FIG. 13, cell plate voltage VCP generated from a cell plate voltage generating circuit 65 is transmitted on a main cell plate voltage line 66 extending along the column direction of the memory array. Main cell plate voltage line 66 branches into a local cell plate voltage line 67 in a sense amplifier band SAB. Local cell plate voltage line 67 applies cell plate voltage VCP to cell plate electrodes 54 respectively arranged corresponding to the memory blocks provided to sense amplifier band SAB. Local cell plate voltage line 67 also transmits cell plate voltage VCP to dummy aluminum interconnection layer 55. Local cell plate voltage line 67, for instance, is formed in the same interconnection layer as that in which a transmission line for transmitting a bit line precharge voltage VBL is formed. Thus, cell plate electrode 54 and dummy aluminum interconnection layer 55 can be easily fixed at the same voltage level.

Moreover, local cell plate voltage line 67 can be provided in a sub word driver band SWB in place of sense amplifier band SAB. In this case, a slit of dummy aluminum interconnection layer 55 would lie in the same direction as the main word lines so that dummy aluminum interconnection layer (lines) 55 and main word lines can be provided at the same pitch.

Figure 14:
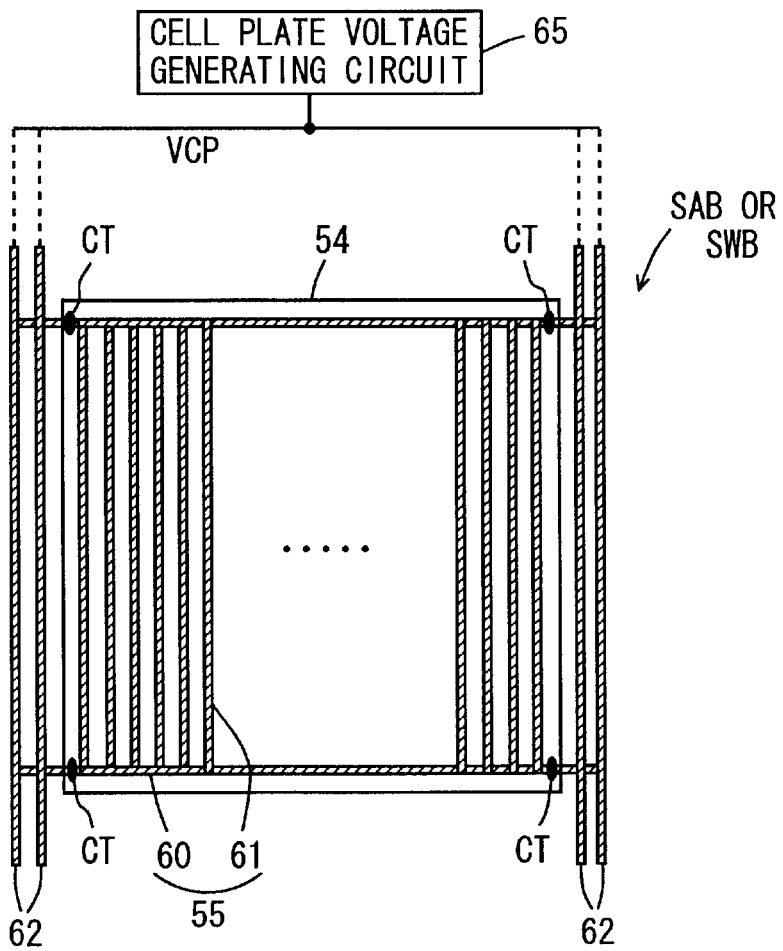
FIG. 14 is a schematic representation of the arrangement of a modification of the third embodiment of the present invention.

FIG. 14 is a schematic representation of another arrangement in which the cell plate electrode and the dummy aluminum interconnection layer are fixed to the same voltage. In FIG. 14, dummy interconnection lines 62 are coupled to end interconnection line 60, and cell plate voltage VCP is transmitted from cell plate voltage generating circuit 65 to dummy interconnection lines 62. Dummy interconnection lines 62 are connected to end aluminum interconnection line 60 of dummy aluminum interconnection layer 55. Dummy interconnection lines 62 are also connected to cell plate electrode 54 via a contact hole (or a through hole) CT in a portion where dummy interconnection lines 62 and end interconnection line 60 are connected. Thus, dummy interconnection lines 62 are utilized as the cell plate voltage lines for transmitting the cell plate voltage to cell plate electrode 54. Dummy interconnection lines 62 may be provided in the region of the sub word driver band or the sense amplifier band.

Furthermore, instead of the above-described arrangements, the following arrangement can also be implemented. The cell plate voltage is transmitted from cell plate voltage generating circuit 65 to cell plate electrodes 54 provided to the respective memory blocks. For each memory block, dummy aluminum interconnection layer 55 is individually formed with slits, and dummy aluminum interconnection layer 55 and a corresponding cell plate electrode 54 are directly connected via a contact or a through hole on a memory block basis.

The first level aluminum interconnection layer is utilized entirely as the dummy aluminum interconnection layer within the memory array. The interconnection lines conventionally formed using the first level aluminum interconnection layer are formed of the second or the third level aluminum interconnection lines of an upper layer.

As described above, according to the third embodiment of the present invention, the cell plate electrode layer and the first level aluminum interconnection layer above the cell plate electrode layer are fixed to the same potential so that no erroneous operation occurs even when the cell plate electrode layer and the conductive layer laid immediately above the cell plate electrode layer short-circuit electrically, and stable operation of the DRAM as well as improved yield can be achieved.

Fourth Embodiment

FIG. 15 is a schematic representation of the arrangement of a main portion of a semiconductor memory device according to the fourth embodiment of the present invention. Referring to FIG. 15, in a sense amplifier band SAB, a column select signal from a Y decoder YD is transmitted on a main column select line group ZMCSLG provided in common to all memory blocks of the row blocks related to sense amplifier band SAB. Column select lines ZMCS0 to ZMCS7 included in main column select line group ZMCSLG are each formed by a third level aluminum interconnection (3Al) line.

Column select gates rendered conductive in response to a column select signal are disposed in sense amplifier group regions SGRa, SGRb, and SGRc corresponding to the respective memory blocks. Local column select lines LCSL0 to LCSL7 are arranged over two memory blocks, i.e., over two sense amplifier group regions. Drivers DV0 to DV7 for driving local column select lines LCSL0 to LCSL7 according to the column select signal on main column line group ZMCSLG are provided in the cross bands CRa and CRb which are the regions where sub word driver bands SWB and sense amplifier band SAB intersect.

In order to arrange the drivers with enough margin, drivers DV0 to DV7, like the sub word drivers, are alternately disposed. Therefore, among local column select lines LCSL0 to LCSL7 provided in one sense amplifier band region, the local column select lines adjacent to one another in the column direction are driven by drivers disposed in different cross bands. In other words, local column select lines LCSL0, LCSL2, LCSL4, and LCSL6 are driven by drivers DV0, DV2, DV4, and DV6 provided in cross band CRb respectively, while local column select lines LCSL1, LCSL3, LCSL5, and LCSL7 are driven by drivers DV1, DV3, DV5, and DV7 provided in cross band CRa. Although not clearly shown, local column select lines LCSL0 to LCSL7 are arranged in each of sense amplifier group regions SGRa and SGRc, and are driven according to the signal on the main column select line group by the drivers disposed in the adjacent cross bands.

As shown in FIG. 15, by providing a hierarchical structure to the column select lines and by alternately disposing the drivers for driving the local column select lines in the cross bands, the drivers can be disposed with enough margin even when the pitch for the local column select lines becomes small, and a column select signal can be driven to the definite state at a high speed.

Moreover, local column select lines LCSL0 to LCSL7 are formed by the first level aluminum interconnection lines, and are connected to a first level polysilicon gate electrodes of column select gates respectively. Since no column select gate is connected to main column select line group ZMCSLG, the parasitic capacitance of main column select line group ZMCSLG is small so that a column select signal from Y decoder YD can be transmitted at a high speed from one end to the terminal end of sense amplifier band SAB. The local column select lines to which many column select gates are actually connected, are driven at a high speed by drivers DV0 to DV7 provided in the cross bands. As a result, the column select operation can be performed quickly, and the column access time (the time required from the designation of a read/write operation to the outputting of valid data) can be reduced.

Furthermore, by alternately disposing the drivers for driving the column select lines in the cross bands, the number of drivers disposed in each cross band can be reduced, and the column select lines having a hierarchical structure can be implemented without increasing the cross band area, and therefore, the memory array area.

Fifth Embodiment

Figure 16:
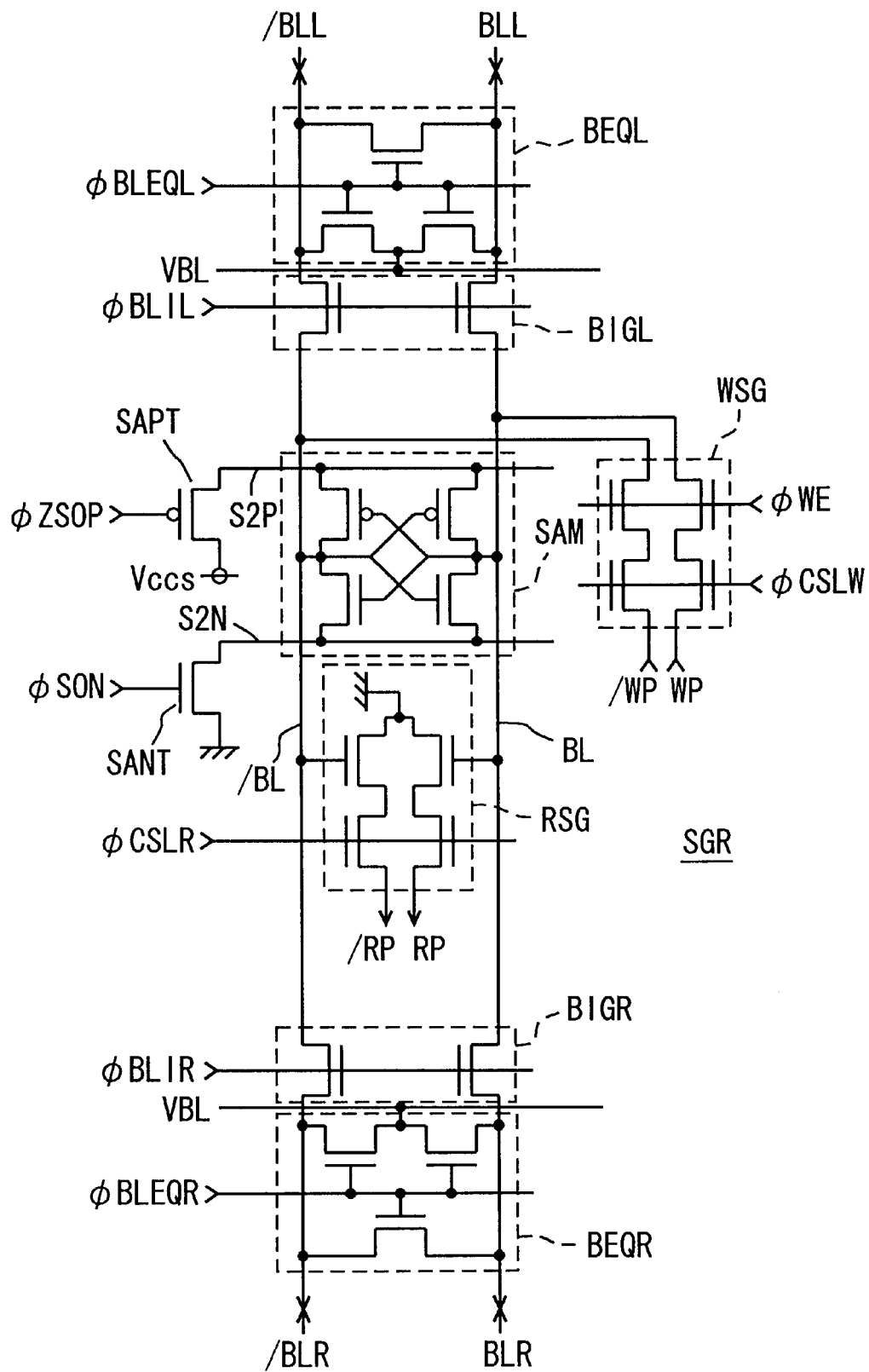
FIG. 16 is a schematic representation of a portion related to a sense amplifier of a semiconductor memory device according to the present invention.

FIG. 16 is a diagram representing the arrangement of a portion corresponding to one sense amplifier in a sense amplifier group region SGR of a semiconductor memory device according to the present invention. In FIG. 16, bit lines BLL and /BLL are provided with a bit line precharging/equalizing circuit BEQL for precharging and equalizing bit lines BLL and /BLL to a prescribed voltage VBL in response to a bit line equalizing instruction signal φBLEQL, and a bit line isolation gate BIGL rendered conductive, in response to a bit line isolation instruction signal φBLIL, for coupling bit lines BLL and /BLL to a sense amplifier SAM.

Bit lines BLR and /BLR are provided with a bit line precharging/equalizing circuit BEQR activated, in response to a bit line equalizing instruction signal φBLEQR, for precharging and equalizing bit lines BLR and /BLR to a bit line precharge voltage VBL, and a bit line isolation gate BIGR rendered conductive in response to a bit line isolation instruction signal φBLIR, for coupling bit lines BLR and /BLR to sense amplifier SAM.

Sense amplifier SAM includes cross-coupled P-channel MOS transistors and cross-coupled N-channel MOS transistors. A power-supply node S2P of sense amplifier SAM is coupled to a sense power-supply node receiving a sense power-supply voltage VCCS via a sense amplifier activating transistor SAPT which in turn is activated in response to a sense amplifier activating instruction signal φZSOP. Moreover, another power-supply node S2N of sense amplifier SAM is coupled to a ground node via a sense amplifier activating transistor SANT which in turn is rendered conductive in response to a sense amplifier activating signal φSON.

A read column select gate RSG rendered conductive in response to a read column select signal φCSLR for differentially amplifying the potentials on common bit lines BL and /BL and transmitting the differentially amplified potentials to read data line pair RB and /RB, and a write column select gate WSG for coupling common bit lines BL and /BL to write data line pair WP and φWP in response to a write column select signal φCSLW and a write mask instruction signal φWE are provided for sense amplifier SAM. Here, common bit lines BL and /BL are the bit lines to which sense amplifier SAM is connected. Common bit lines BL and /BL are coupled to bit lines BLR and BLL and bit lines /BLR and /BLL respectively in the standby state or in the unselected state.

In the arrangement shown in FIG. 16, read data lines RP and /RP and write data lines WP and /WP are provided separately. In other words, the arrangement shown in FIG. 16 is of the so-called separated IO structure. In the separated IO structure, read column select signal φCSLR is driven to the active state according to an address signal in a data read operation. In a data write operation, the column select operation is performed according to write column select signal φCSLW. Write mask instruction signal φWE instructs whether the data write to a selected memory cell is to be masked or not. A data mask instruction signal DQM from an outside selectively activates write mask instruction signal φWE in a data write operation.

In the case of the separated IO structure as shown in FIG. 16, a read column select signal and a write column select signal must be separately generated and transmitted. Therefore, Y decoders for generating column select signals include write column decoders activated in a write operation and read decoders activated in a read operation. As a result, the number of column select signals in this case is doubled in comparison with the case shown in relation to the previous FIG. 2 and the like, resulting in an increased area occupied by the interconnections lines.

Figure 17:
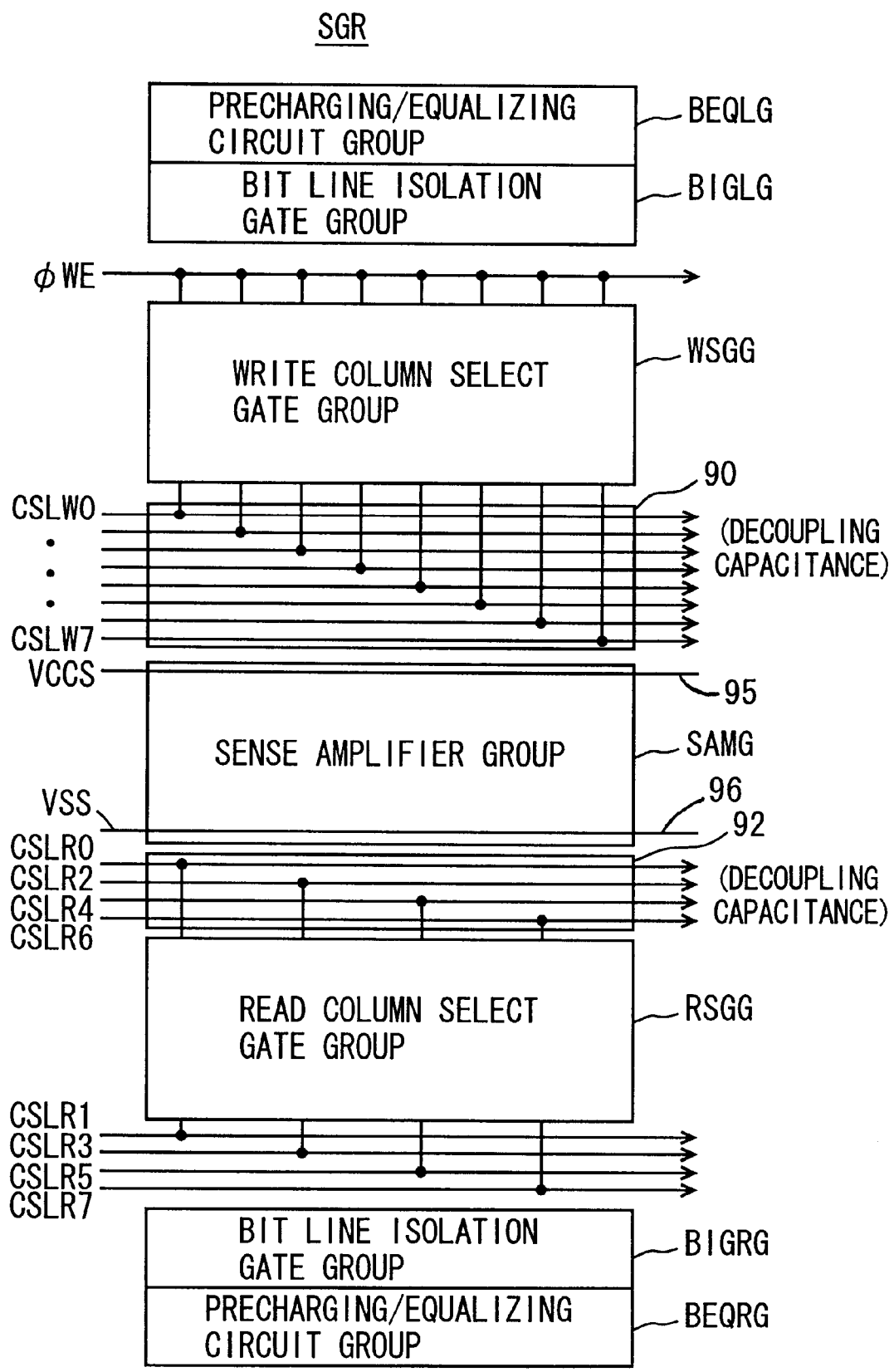
FIG. 17 is a schematic representation of an arrangement of a sense amplifier group region in a fifth embodiment of the present invention.

FIG. 17 is a schematic representation of the arrangement of a sense amplifier group region SGR of a semiconductor memory device according to the fifth embodiment of the present invention. In FIG. 17, a precharging/equalizing circuit group BEQLG and a bit line isolation gate group BIGLG are provided for one memory block in sense amplifier group region SGR. A write column select gate group WSGG is provided adjacent to bit line isolation gate group BIGLG. Write column select gate group WSGG includes write column select gates respectively receiving the write column select signals from write column select lines CSLW0 to CSLW7. In this case, write column select gates of 8 bits are provided in write column select gate group WSGG. Normally, the masking of a data write is performed in a unit of 8 bits, and FIG. 17 shows the arrangement of the portion forming the unit for a write mask.

A sense amplifier group SAMG is provided adjacent to the region where write column select lines CSLW0 to CSLW7 are arranged. Eight sense amplifiers are provided in sense amplifier group SAMG.

Read column select lines CSLR0, CSLR2, CSLR4, and CSLR6 are arranged adjacent to sense amplifier group SAMG, and read column select lines CSLR1, CSLR3, CSLR5, and CSLR7 are provided in a different region. A read column select gate group RSGG is arranged between these read column select lines CSLR0, CSLR2, CSLR4, and CSLRG and read column select lines CSLR1, CSLR3, CSLR5, and CSLR7. In the other memory block, a bit line isolation gate group BIGRG and a precharging/equalizing circuit group BEQRG are provided.

In the arrangement shown in FIG. 17, a region 90 in which eight write column select lines CSLW0 to CSLW7 are disposed is the region required only for the disposition of write column select lines and no transistor is provided in this region (write column select lines CSLW0 to CSLW7 are formed at the first level aluminum interconnection layer or the first level/third level aluminum interconnection layers). A region 92 in which read column select lines CSLR0, CSLR2, CSLR4, and CSLR6 are provided is only used for the disposition of read column select lines, and no transistor is provided in this region. Thus, these column select line disposing regions 90 and 92 provide empty regions. Since power-supply lines for transmitting a sense power-supply voltage VCCS and a ground voltage VSS are provided for instance, by the first level aluminum interconnection lines in sense amplifier group SAMG. Decoupling capacitances for stabilizing sense power-supply voltage VCCS and ground voltage VSS are provided in regions 90 and 92.

Figure 18:
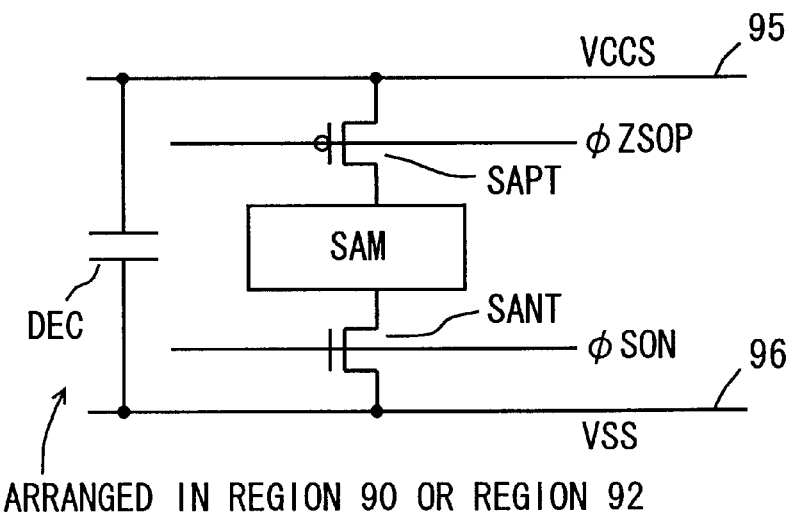
FIG. 18 is a diagram illustrating the connection of the decoupling capacitance in the fifth embodiment of the present invention.

Thus, as shown in FIG. 17, a sense power-supply line 95 for transmitting sense power-supply voltage VCCS and a sense ground line 96 for transmitting ground voltage VSS are provided extending along the row direction in the sense amplifier group. A decoupling capacitance DEC is provided between sense power-supply line 95 and sense ground line 96 as shown in FIG. 18. Thus, when sense amplifier SAM is activated by sense amplifier activating transistors SAPT and SANT to perform a sensing operation, a rapid drop in sense power-supply voltage VCCS on sense power-supply line 95 and a sharp rise in ground voltage VSS on sense ground line 96 can be prevented so that a stable sensing operation can be performed.

Figure 19A:
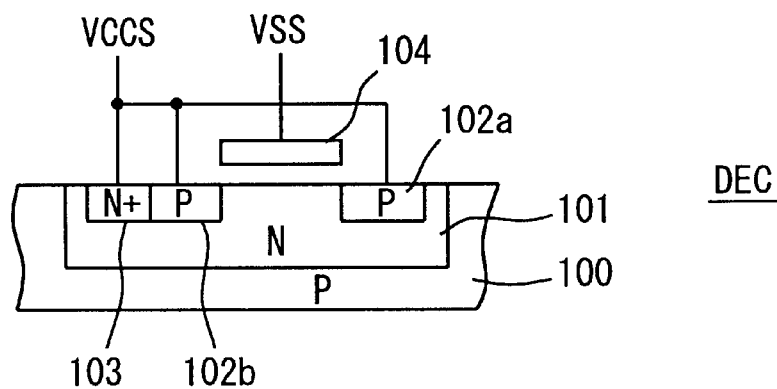
FIGS. 19A and 19B are schematic representations of the cross sections of the structures of the decoupling capacitance shown in FIG. 18.

FIG. 19A is a diagram representing an example of the structure of decoupling capacitance DEC. In FIG. 19A, decoupling capacitance DEC includes an N-type well 101 formed on a P-type semiconductor substrate region 100, P-type impurity regions 102a and 102b formed spaced apart on the surface of N-type well 101, a high concentration N-type impurity region 103 formed on the surface of N-type well 101, and a gate electrode layer 104 formed above the region between impurity regions 102a and 102b with a gate insulating film, not shown, formed therebetween. Ground voltage VSS is applied to gate electrode layer 104. Impurity regions 102a, 102b, and 103 receive sense power-supply voltage VCCS from sense power-supply line 95. In this case, decoupling capacitance DEC is an MOS type capacitor utilizing a P-channel MOS transistor. The use of such an MOS capacitor allows decoupling capacitance DEC to be formed in the same manufacturing step as the formation of other transistors. Decoupling capacitance DEC shown in FIG. 19A is provided in region 90 or in region 92. The decoupling capacitances are suitably formed in regions 90 and 92 according to the conductivity types of the nearby substrate regions, and their capacitance values are suitably determined according to the magnitude of the sensing currents and the parasitic capacitances of the sense power-supply line and the sense ground line.

Figure 19B:
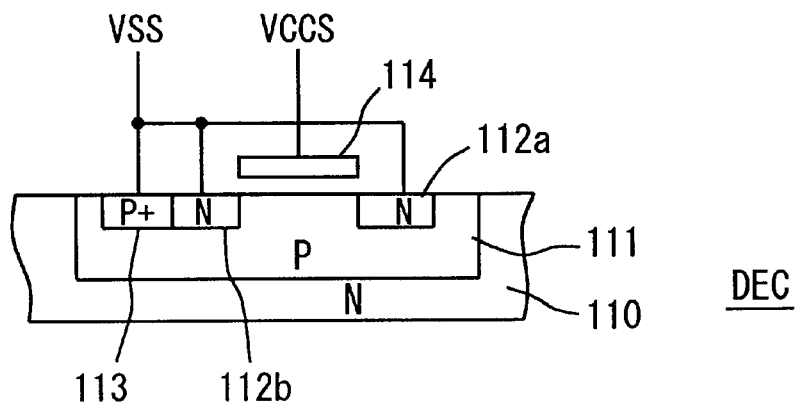

FIG. 19B is a diagram representing another arrangement of decoupling capacitance DEC. In FIG. 19B, decoupling capacitance DEC includes a P-type well 111 formed on the surface of an N-type semiconductor substrate region 110, N-type impurity regions 112a and 112b formed on the surface of P-type well 111, a high concentration P-type impurity region 113 formed on the surface of P-type well 111, and a gate electrode layer 114 formed above the region between impurity regions 112a and 112b with a gate insulating film, not shown, formed therebetween. Sense power-supply voltage VCCS is applied to gate electrode layer 114, and sense ground voltage VSS is applied to impurity regions 112a, 112b, and 113. In this case, decoupling capacitance is an MOS capacitor using an N-channel MOS transistor. Thus, the decoupling capacitance having a large capacitance value can be formed in a relatively small area.

The decoupling capacitances shown in FIGS. 19A and 19B are formed in an appropriate manner according to the conductivity types of the substrate regions near interconnection line regions 90 and 92 shown in FIG. 17.

In addition, a normal parallel electrode capacitor simply formed by a gate electrode layer and a high concentration impurity region formed on a surface of the semiconductor substrate region facing the gate electrode layer may be employed as decoupling capacitance DEC.

Modification

FIG. 20 is a diagram representing the arrangement of a modification to the fifth embodiment of the present invention. FIG. 20 shows the arrangement of one sense amplifier group region SGR. In FIG. 20, sense amplifier activating transistors SAPT and SANT are provided in common to a prescribed number of sense amplifiers SAM. Power-supply nodes S2P and S2N are provided in common for each prescribed number of sense amplifiers SAM, and are coupled to a sense power-supply line 95 and a sense ground line 96 via sense amplifier activating transistors SAPT and SANT respectively. Sense amplifier activating transistor SAPT is provided within region 90, and sense amplifier activating transistor SANT is provided in region 92.

Since sense amplifier activating transistors need not be provided in a cross band, transistors of other circuits can be increased in size or in number in the cross band. In addition, by providing a plurality of sense amplifier activating transistors SAPT within one sense amplifier group region SGR, the voltage distribution of power-supply nodes S2P and S2N of sense amplifiers SAM can be limited, which allows a more stable sensing operation. The number of sense amplifiers forming a unit has only to be determined in a suitable manner.

Further, in FIG. 20, sense amplifier activating transistor SAPT is provided in region 90, while sense amplifier activating transistor SANT is provided in region 92. According to the actual arrangement of sense power-supply line 95 and sense ground line 96 and the arrangement of the transistors of sense amplifiers SAM, however, these sense amplifier activating transistors SAPT and SANT may be arranged in reversed manner; that is to say, sense amplifier activating transistor SANT may be disposed in region 90, while sense amplifier activating transistor SAPT is provided in region 92.

As described above, according to the fifth embodiment of the present invention, when write data line pair and the read data line pair are provided separately, the region below the column select lines are utilized for a decoupling capacitance or as the region for disposing sense amplifier activating transistors so that the memory array region can be utilized effectively. Thus, even when the column select lines are provided along the row direction, the increase in memory array area can be suppressed, and a stable sensing operation can be achieved.

Sixth Embodiment

FIG. 21 is a schematic representation of the layout for a pair of cross-coupled transistors of a cross-coupled type sense amplifier SAM. In FIG. 21, respective gates of cross-coupled MOS transistors Qa and Qb are formed in a ring-like shape. MOS transistor Qa has a gate coupled BL via a contact hole CTa. MOS transistor Qa has a region (drain) surrounded by a gate electrode connected to a bit line /BL via a contact hole CTb to a bit line. In MOS transistor Qb, bit line /BL is coupled to a ring-like shaped gate electrode via a contact hole CTa, and bit line BL is coupled via a contact hole CTb to a region inside the gate electrode. A field region FR is a common node (node S2P or node S2N) for sense amplifiers SAM and is shared by a plurality of sense amplifiers. By utilizing this ring gate transistor in which a gate electrode is formed in a ring-like shape, cross-coupled MOS transistors can be arranged according to the pitch of bit lines BL and /BL. Such a ring gate transistor can be utilized because sense amplifiers SAM share common nodes.

On the other hand, in a write column select gate, an MOS transistor for receiving a write column select signal and an MOS transistor for receiving a write mask instruction signal φWE are connected in series. Every write column select signal must control the conduction of a write column select gate individually, and unlike sense amplifiers SAM, common nodes do not exist. Therefore, a certain designing effort on the layout becomes necessary in order to arrange such a pair of MOS transistors connected in series according to the pitch of bit lines BL and /BL.

FIG. 22A is a schematic representation of the layout for a transistor of a write column select gate according to the sixth embodiment of the present invention. In FIG. 22A, two field regions 100 and 102 are provided. A transistor formed in field region 100 is coupled to a write data path /WP, while a transistor pair coupled to a write data path WP are formed in the other field region 102. First level polysilicon interconnection lines 103 and 106 for receiving a write mask instruction signal φWE are disposed intersecting with field regions 100 and 102. First level polysilicon interconnection lines 103 and 106 are connected with one another by a connecting line 107. Write mask instruction signal φWE is transmitted via a second level aluminum interconnection line or a third aluminum interconnection line at an upper layer.

First level polysilicon interconnection lines 104 and 105 for transmitting write column select signals CSLW0 and CSLW1 respectively are provided adjacent to first level polysilicon interconnection lines 103 and 106. As in the case described in relation to the previous first embodiment, write column select signals CSLW0 and CSLW1 are also transmitted via the third level aluminum interconnection lines in an upper layer, and thereafter, are transmitted via local column select lines of the lower first level aluminum interconnection layer.

In either of field regions 100 and 102, a bit contact 110 is formed outside first level polysilicon interconnection line 103, a bit contact 111 is formed between first level polysilicon interconnection lines 104 and 105, and a bit contact 112 is formed outside first level polysilicon interconnection line 106. The field region of bit contact 110 and the field region between first level polysilicon interconnection lines 103 and 104 form a pair of transistors TR1 and TR3, and the field region between first level polysilicon interconnection lines 103 and 104 and the field region where bit contact 111 is formed together form transistors TR2 and TR4, respectively, which are connected in series with the respective transistors TR1 and TR3.

The write gate for receiving write column select signal CSLW0 is configured in a similar manner.

Bit contact 111 is shared by two adjacent write column select gates so that the area occupied by the write column select gates and the pitch of the write column select gates are reduced.

FIG. 22B is a diagram of the interconnection layout showing the connections of write column select gates and bit lines. A pair of bit lines BL1 and ZBL1 are common bit lines. Bit line BL is formed by a second level polysilicon interconnection line 120, and is coupled to a second level polysilicon interconnection line 122 provided in alignment with bit line ZBL1 by a first level polysilicon interconnection line 121. On the other hand, a second level polysilicon interconnection line 123 forming bit line ZBL1 is coupled to a second level polysilicon interconnection line 126 extending in alignment with bit line BL1 via contact hole 124 by first level metal interconnection line 125. The positions of bit lines BL1 and ZBL1 are interchanged using these twisted lines 121 and 125.

Second level polysilicon interconnection line 126 is connected to field region 100 via bit contact 110. Second level polysilicon interconnection line 126 is further connected to a second level polysilicon interconnection line 128 extending in alignment with bit line ZBL1 via a first level polysilicon interconnection line 127. Second level polysilicon interconnection line 122 is connected to a first level metal interconnection line 129 via contact hole 124. First level metal interconnection line 129 is connected to a second level polysilicon interconnection line 130 extending in alignment with bit line BL1 via contact hole 124. Second level polysilicon interconnection line 130 is connected to field region 102 via bit contact 110. Therefore, the positions of bit lines BL1 and ZBL1 are interchanged in field region 100, and once again are interchanged in field region 102. By alternately connecting different interconnection layers, i.e., first level polysilicon interconnection lines 121 and 127 with first level metal interconnection lines 129 and 125, respectively, in these two crossing regions, bit lines BL1 and ZBL1 are made to possess identical electrical characteristics.

At the same time as the formation of first level metal interconnection lines 125 and 129, a first level metal interconnection line 131 to be a global write data line ZGW forming a write data path /WP and a first level metal interconnection line 132 are respectively formed for field regions 100 and 102 near the respective bit contacts 111. First level metal interconnection line 131 is connected to field region 100 via contact hole 124, a second level polysilicon interconnection line 133 of an intermediate layer, and bit contact 111. First level metal interconnection line 132 is connected to field region 102 via contact hole 124, a second level polysilicon interconnection line 134 at an intermediate layer, and bit contact 111.

Similarly, the positions of bit lines ZBL0 and BL0 are interchanged by the twisted lines in field regions 100 and 102. In the arrangement shown in FIG. 22B, bit line BL1 is connected to a global write data line GW via bit contacts 110 and 111 formed in field region 102 and via contact 124 (when both column select signal CSLW1 and write mask instruction signal φWE are at logical high level). On the other hand, bit line ZBL1 is connected to global write data line ZGW forming write path /WP via bit contacts 110 and 111 formed in field region 100, second level polysilicon interconnection line 133, and contact hole 124.

Since contact hole 124 and bit contact 111 are shared by write column select gates provided for bit lines BL1, ZBL1, ZBL0, and BL0, complementary bit lines ZBL and ZBL0 are provided adjacent to each other on the memory cell array. Thus, even in field regions 100 and 102, bit lines of the same characteristics, (i.e., a true bit line or a complementary bit line) are provided adjacent to one another as for true bit line BL and complementary bit line ZBL.

As shown in FIG. 22B, a transistor of a write column select gate can be formed by an MOS transistor extending in the column direction. In addition, bit contacts can be provided in alignment in the column direction, and write column select gates can be provided according to the bit line pitch. Moreover, a bit contact can be formed in a region remote from a column select line CSLW and the first level polysilicon interconnection line for transmitting write mask instruction signal φWE. Consequently, the first level polysilicon interconnection line for transmitting write mask instruction signal φWE and the first level polysilicon interconnection line for transmitting a write column select signal can be disposed adjacent to one another at an extremely small pitch (since there is no need to avoid the bit contact). Furthermore, since a gate electrode of an MOS transistor of a write column select gate is provided extending in the column direction, the gate width can be made large enough even when the transistor of the write column select gate is disposed according to the sufficiently small bit line pitch so that a write column select gate transistor having a large current drivability can be formed.

In addition, first level metal interconnection lines 125, 129, 131, and 132 can be utilized in the write column select gate because in this region, a sense-related signal is transmitted using a second level aluminum interconnection line or a third level aluminum interconnection line, and empty region exists for the first level metal (aluminum) interconnection line in the region of the write column select gate. Thus, the multi-layer interconnection structure can be effectively utilized to form a write column select gate having an extremely small pitch according to the bit line pitch.

Moreover, with the twisted structure of the bit lines within write column select gates, bit contacts having the same characteristics can be aligned along the column direction, and the pitch for the bit contacts can be made sufficiently large so that the pitch for the write column select gates can be reduced (for instance, when bit contact 110 for a bit line is provided near bit contact 111, their pitch in the row direction should be widened in order to provide these contacts).

Figure 23:
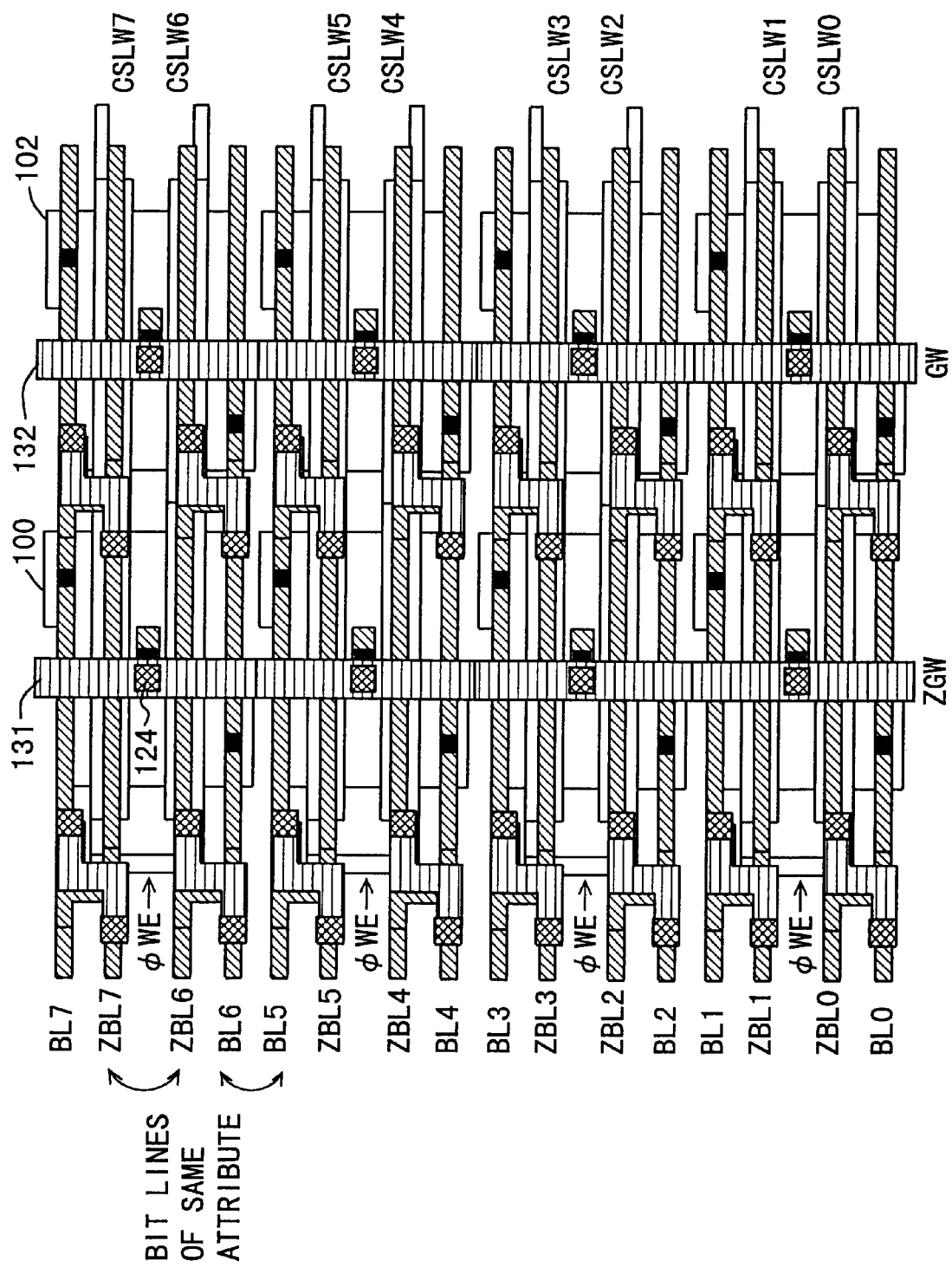
FIG. 23 is a diagram representing the layout for the write column select gate according to the sixth embodiment of the present invention.

FIG. 23 is a diagram illustrating the layout for the write column select gates corresponding to eight sense amplifiers. The transistor formed in field region 100 is coupled to a first level aluminum (metal) interconnection line 131 forming a global write data line ZGW corresponding to a write data path /WP. On the other hand, the transistor formed in field region 102 is connected to a first level metal interconnection line 132 forming a global write data line GW coupled to a write data path WP. The positions of the bit lines are interchanged each of these in field regions 100 and 102. Since the write column select gates need to share the contact holes in a pair of adjacent bit lines, the adjacent bit lines in the adjacent bit line pair are of the same characteristics (a true bit line or a complementary bit line) for bit lines BL0 to BL7 and ZBL0 to ZBL7. For instance, a bit line ZBL6 is provided adjacent to a bit line ZBL7, and a bit line BL5 is provided adjacent to a bit line BL6. Thus, the positions of the true bit line and the complementary bit line are interchanged for each bit line pair.

A write column select signal is transmitted from a main column select line formed in the third level aluminum interconnection line at an upper layer via a local write select line formed in the first level metal interconnection layer. Contacts are provided to these lines in a suitable manner in positions not shown (for instance, the first level polysilicon interconnection lines for transmitting write column select signals and the first level metal interconnection lines forming the local write column select lines at an upper layer may be connected in a position aligned with contact 124).

The write mask instruction signal is transmitted via third level or second level interconnection layer, and thereafter is transmitted to a gate of a write column select gate transistor. As regards the write mask instruction signal, a contact may be made between the transistor of the write column select gate and the write mask instruction signal transmission line in an upper layer in a position aligned with contact hole 124.

Similar layout can be utilized for a read column select gate (the electrode layer for transmitting a write mask instruction signal φWE is unnecessary, however, and the first level polysilicon interconnection line forming the gate electrode for receiving the write mask instruction signal is connected to the second level polysilicon interconnection line connected to the bit lines). The bit contacts can be provided in alignment in the column direction in this case as well, so that the pitch condition for the read column select gates can be mitigated, and the read column select gates can be arranged with sufficient margin.

Lines 131 and 132 forming write data paths WP and /WP are coupled in a suitable position to a main write data line at an upper layer extending in the column direction.

As described above, according to the sixth embodiment of the present invention, in the separated IO structure in which write data lines and read data lines are separately provided, bit lines are formed with a twisted structure in the write column select gates so that the positions of bit contacts can be aligned along the column direction, the pitch of the write column select gates in the row direction can be reduced, and the write column select gates can be provided according to the bit line pitch.

Moreover, although not clearly shown in FIG. 23, first level metal interconnection lines 131 and 132 forming write data lines GW and ZGW are connected to the third level metal interconnection provided extending in the column direction across the memory array.

Seventh Embodiment

Figure 24:
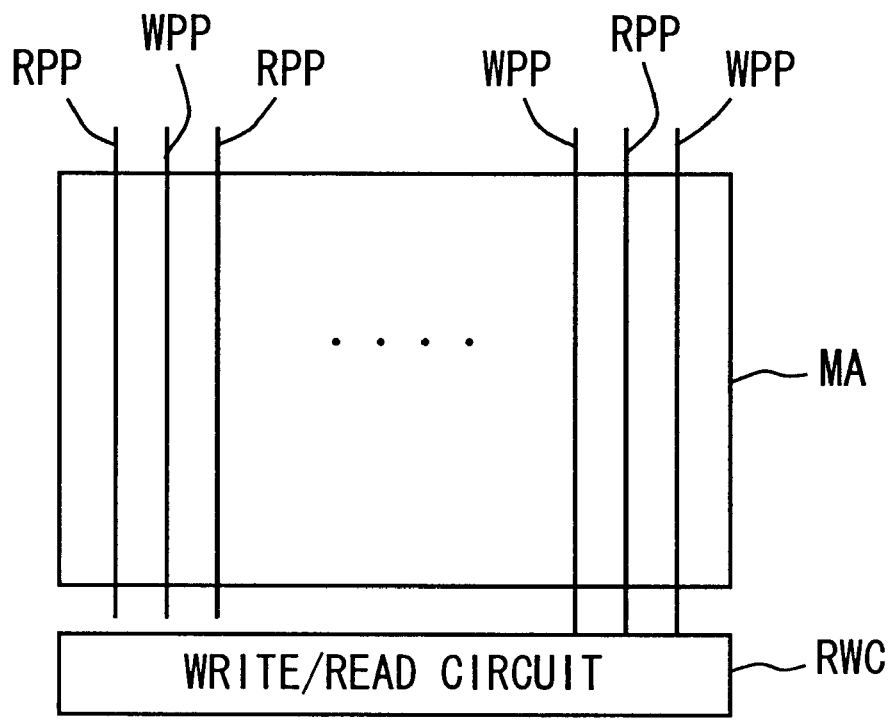
FIG. 24 is a schematic representation of the arrangement of an array portion of a semiconductor memory device according to a seventh embodiment of the present invention.

FIG. 24 is a schematic representation of the arrangement of an internal data line according to the seventh embodiment of the present invention. In FIG. 24, a write data line pair WPP and a read data line pair RPP are arranged extending in the column direction over a memory array MA. These write data line pair WPP and write data line pair RPP are formed, for instance, at a third level aluminum interconnection layer. Write data line pair WPP and read data line pair RPP are coupled to a write/read circuit RWC including a write driver and a preamplifier.

Figure 25:
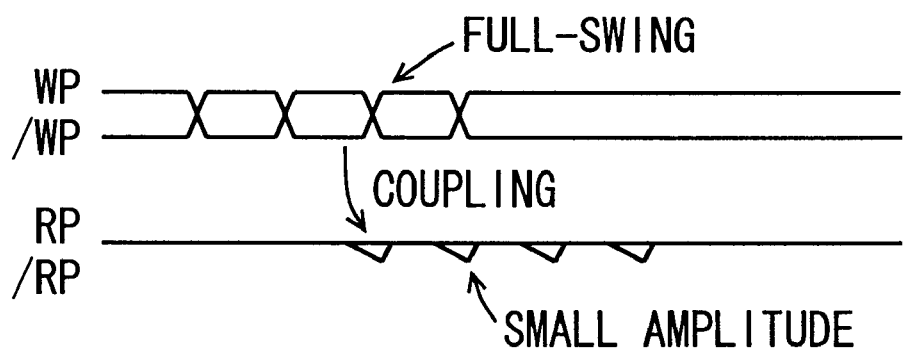
FIG. 25 is a diagram schematically illustrating the signal amplitudes transmitted on a write data line and a read data line in an array structure shown in FIG. 24.

The memory cell data amplified by a sense amplifier is transmitted to the read data line pair. On the other hand, the internal write data generated by a write driver having a large drivability included in write/read circuit RWC is transmitted to write data line pair WPP. Therefore, the signal amplitudes differ in this case as shown in FIG. 25. In other words, as shown in FIG. 25, the signal amplitude of write data line pair WP and /WP is at the power-supply voltage level and full-swings, while on read data line pair RP and /RP driven only by a sense amplifier circuit, the signal has a small amplitude. Therefore, when such write data line pair WPP and read data line pair RPP are provided adjacent to one another, and the data transfers are performed simultaneously, mutual interference due to capacitive coupling occurs, causing the read data of the small amplitude signal to vary, and the margin of the read data becomes smaller so that accurate data read operation may not be performed. Thus, a shield line is disposed as shown in FIG. 26 in order to prevent the influence of the coupling noise from write data line pair WPP to read data line pair RPP.

Figure 26:
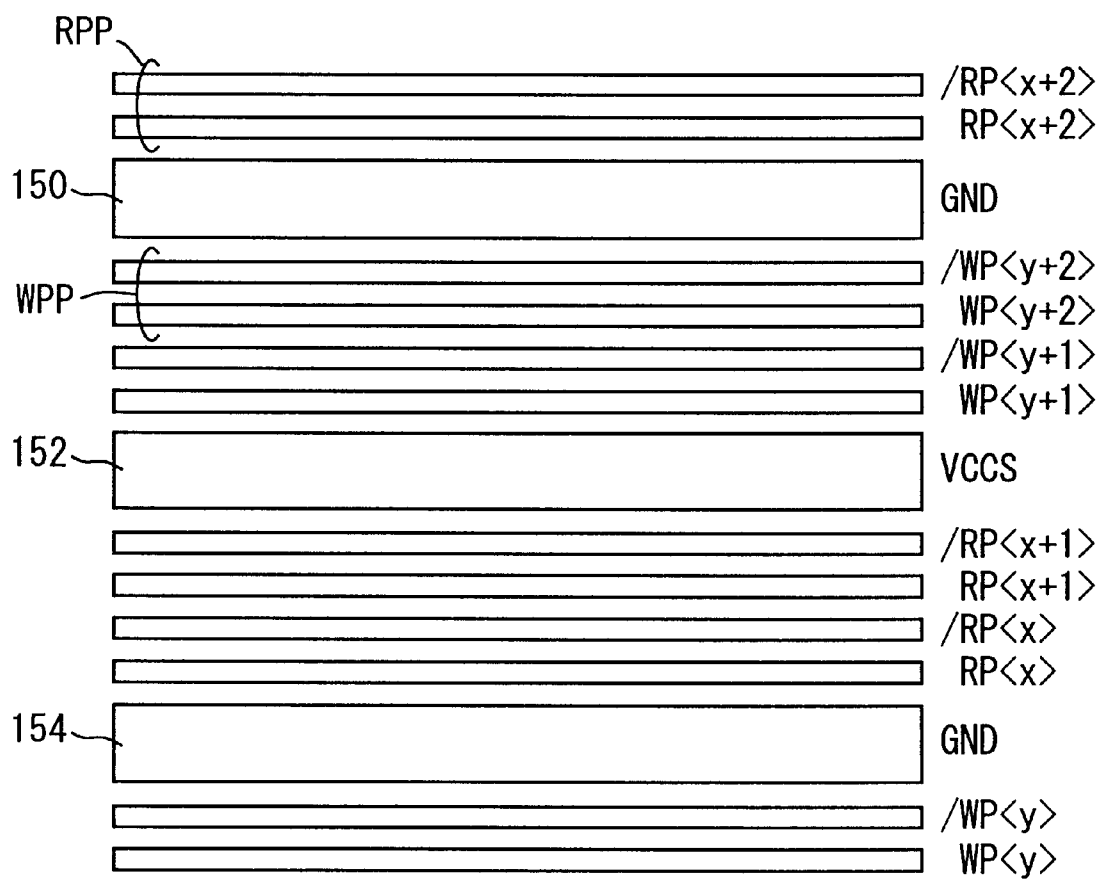
FIG. 26 is a schematic representation of the arrangement of write/read data lines according to the seventh embodiment of the present invention.
Figure 27:
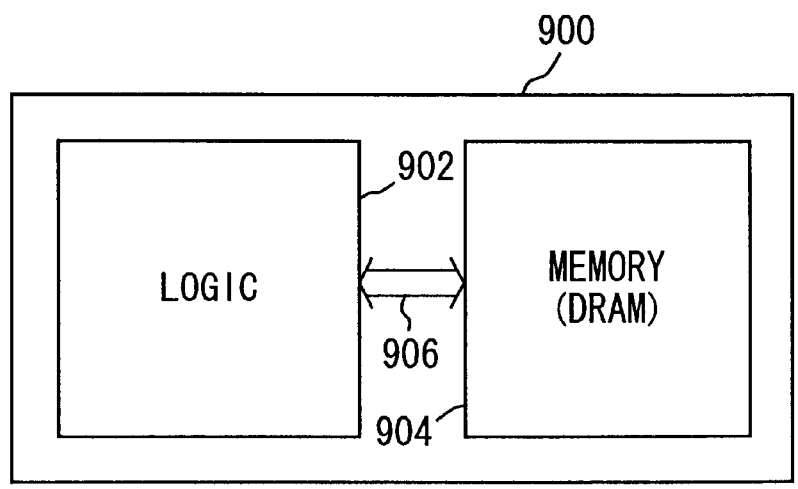
FIG. 27 is a schematic representation of the arrangement of a conventional logic-merged memory.
Figure 28:
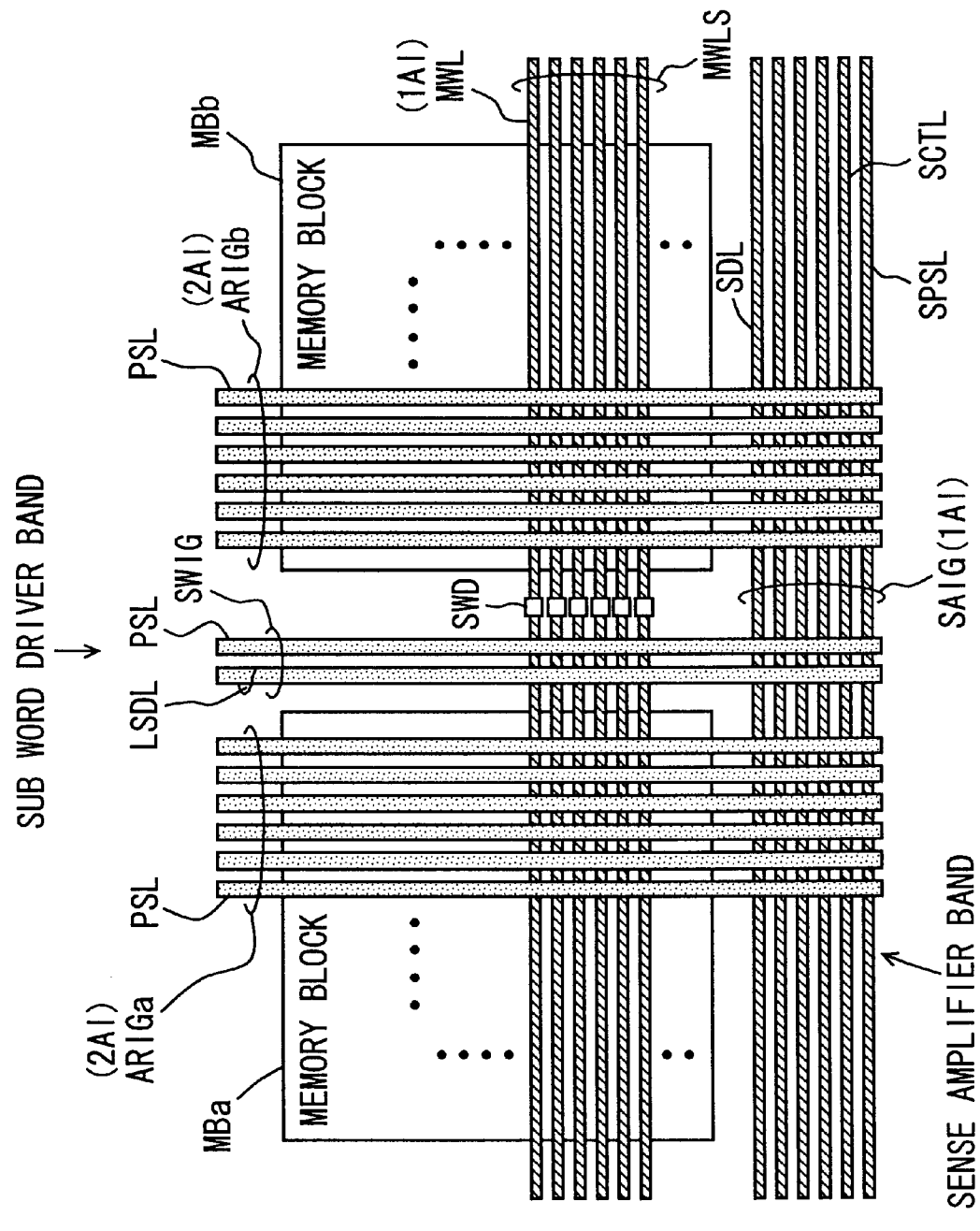
FIG. 28 is a schematic representation of the interconnection structure of an array portion of the conventional logic-merged memory.

In FIG. 26, read data lines RP<X>, /RP<X> to RP<X+2>, /RP<X+2> are provided. In addition, write data lines WP<Y>, /WP<Y> to WP<Y+2>, /WP<Y+2> are provided. These are formed by an upper layer metal interconnection line. They may be formed by a second level aluminum interconnection line or a third level aluminum interconnection line.

With a plurality of these write data lines or a plurality of these read data lines provided as a set, a power-supply line or a ground line forming a shield line is provided between the read data lines and the write data lines in the same layer. In other words, a ground line 154 for transmitting a ground voltage GND is provided between write data line /WP<Y> and read data line RP<X>, and an array power-supply line 152 for transmitting an array power-supply voltage VCCS is provided between read data line /RP <X+1> and write data line WP<Y+1>. In addition, a ground line 150 for transmitting a ground voltage GND is provided between write data line /WP<Y+2> and read data line RP<X+2>. The voltages transmitted by these ground lines 150 and 154 and array power-supply line 152 are fixed, and these lines function as shield layers. Therefore, even when the signals on write data lines WP<Y> to /WP<Y+2> are caused to full-swing by the write data on the write data lines, no coupling noise occurs to the adjacent read data lines so that read data signals of small amplitude can be transmitted in a stable manner.

The operation modes in which write data and read data are transferred at the same time include a write verify read mode for detecting the accurate writing of the data, a read modify write mode for modifying the read data outside and rewriting the modified data, and a mode in which a write operation and a read operation are successively performed to different banks in a multibank configuration.

When write data lines and read data lines are provided in sets respectively, the number of read data lines or write data lines included in each set is arbitrary. The number of shielding conductive lines are limited to the required minimum number. In addition, a power-supply line/ground line serving as a shield layer should be formed of an interconnection line fixed to a constant voltage level and of the same layer as the data lines.

As described above, according to the seventh embodiment of the present invention, when write data lines and read data lines are provided extending in the column direction over the array, the interconnection lines receiving a fixed voltage are formed between write data lines and read data lines in the same layer so that, with the required minimum number of shielding conductive lines, data signals on write data lines are prevented from adversely affecting the data on read data lines as coupling noise, and a semiconductor memory device capable of a stable data read operation can be achieved.

Other Applications

The metal interconnection line may be a copper (Cu) interconnection line instead of the aluminum interconnection.

As seen from the above, in the semiconductor memory device having a multi-layer interconnection structure according to the present invention, the metal interconnection line of an upper layer is utilized as signal lines in the memory array region so that a semiconductor device is provided which achieves a higher speed, a reduced layout area, and improved yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells arranged in rows and columns;
   a sense amplifier band at least including a sense-related circuit and a plurality of sense amplifier circuits provided corresponding to said columns for sensing and amplifying data of a memory cell of a corresponding column when activated; and
   a sense-related signal line for transmitting a signal to a circuit of either of the sense-related circuit and the sense amplifier circuits within said sense amplifier band, said sense-related signal line including a first signal line formed in a first interconnection layer and coupled to a corresponding circuit of said sense amplifier band and a second signal line formed in a second interconnection layer above said first interconnection layer and coupled to said first signal line for transmitting said signal.

2. The semiconductor memory device according to claim 1, wherein said plurality of memory cells are divided into a plurality of memory blocks along a row direction, said first signal line comprises a plurality of divided interconnection lines arranged corresponding to the respective memory blocks and physically separated between adjacent blocks, and said second signal line comprises a common interconnection line provided in common to said plurality of memory blocks and coupled to said plurality of divided interconnection lines.

3. A semiconductor memory device, comprising:

a plurality of memory blocks each having a plurality of memory cells arranged in rows and columns and provided in alignment along a row direction;

a plurality of sub word lines provided corresponding to respective rows in the respective memory blocks and each connected to memory cells of a corresponding row of a corresponding memory block;

a plurality of main word lines provided extending in the row direction in common to said plurality of memory blocks and each provided corresponding to a prescribed number of rows in each of the memory blocks; and a plurality of sub word line drive circuits provided corresponding to the respective sub word lines and each for driving a corresponding sub word line to a selected state according to at least a signal on a corresponding main word line, said plurality of main word lines comprising conductive lines formed in a layer above transistors and interconnection lines forming the sub word line drive circuits.

4. The semiconductor memory device according to claim 3, wherein each of the main word lines is provided corresponding to a set of the prescribed number of rows in each of said memory blocks, and said semiconductor memory device further comprises:

a plurality of sub decode signal lines formed in an interconnection layer below the layer in which said main word lines are formed, for transmitting, to said sub word line drive circuits, sub decode signals for selecting a row out of the set of said plurality of rows.

5. A semiconductor memory device, comprising:

a plurality of memory cells each having a capacitor for storing information;

a cell plate electrode layer forming one electrode of said capacitor and for receiving a predetermined voltage; and a conductive layer formed on said cell plate electrode layer with an interlayer insulating film formed underlaid, for receiving said predetermined voltage.

6. The semiconductor memory device according to claim 5, wherein said conductive layer is formed into a slit structure having a plurality of individual conductive lines each extending along one direction.

7. A semiconductor memory device, comprising:

a plurality of memory cells arranged in rows and columns;

a main column select signal transmission line provided along a row direction, for transmitting a column select signal for selecting a column out of the columns of said plurality of memory cells; and a local column select signal transmission line formed in an interconnection layer below said main column select signal transmission line, for receiving the column select signal on said main column select signal transmission line.

8. The semiconductor memory device according to claim 7, wherein said plurality of memory cells are divided into a plurality of memory blocks along said row direction, said main column select signal transmission line is provided in common to said plurality of memory blocks, and said local column select signal transmission line comprises a plurality of divided local column select line each provided in common to a prescribed number of the memory blocks.

9. The semiconductor memory device according to claim 7, further comprising:

a sense amplifier band including a plurality of sense amplifier circuits provided corresponding to said columns and each for sensing and amplifying data of a memory cell of a corresponding column, wherein the main and local column select signal transmission lines are provided in said sense amplifier band, said main column select signal transmission line includes a plurality of main column select lines for transmitting different column select signals, said local column select signal transmission line includes a plurality of local column select lines provided corresponding to said main column select lines, and each of said local column select lines includes a plurality of divided local column select lines each provided corresponding to a predetermined number of the plurality of memory blocks, and wherein said semiconductor memory device further comprises:

a plurality of drive circuits provided in cross regions between sense amplifier circuit groups for adjacent memory blocks in the row direction and for driving corresponding divided local column select lines according to signals on said main column select lines, the drive circuits for driving a set of different divided local column select lines being provided in adjacent two cross regions in the row direction.

10. A semiconductor memory device, comprising:

a plurality of memory cells arranged in rows and columns;

a plurality of sense amplifier circuits provided corresponding to said columns, each for sensing and amplifying data of a memory cell of a corresponding column when activated;

a sense power-supply line provided extending in a row direction for supplying an operation power-supply voltage to said plurality of sense amplifier circuits;

a plurality of column select lines provided extending in said row direction, for transmitting column select signals for selecting an addressed column from the columns of the memory cells; and a capacitor provided, below said plurality of column select lines, at least partially overlapping, in a plan view, with a region in which said plurality of column select lines are disposed, and coupled to said sense power-supply line.

11. A semiconductor memory device, comprising:

a plurality of memory cells arranged in rows and columns;

a plurality of sense amplifiers provided corresponding to said columns, for sensing and amplifying data of memory cells of corresponding columns when activated;

a plurality of column select lines provided extending in a row direction along said rows, for transmitting column select signals for selecting an addressed column from the columns of the memory cells;

a sense control line provided extending in said row direction, for transmitting a sense control signal for activating the sense amplifiers;

a sense power-supply line provided extending in said row direction, for supplying an operation power-supply voltage to said sense amplifiers; and sense amplifier activating elements provided, in a plan view, in an interconnection region of said plurality of column select lines and activated in response to activation of said sense control signal for coupling said plurality of sense amplifiers to said sense power-supply line, with said sense amplifier activating elements provided one for each prescribed number of sense amplifiers.

12. A semiconductor memory device, comprising:

a plurality of memory cells arranged in rows and columns;

a plurality of sense amplifiers provided corresponding to said columns for sensing and amplifying data of memory cells of corresponding columns when activated;

a write data line pair coupled to a selected column of said plurality of memory cells for transmitting write data to the selected column;

a plurality of bit line pairs arranged corresponding to the columns of the memory cells; and a plurality of write gate circuits provided corresponding to the columns of the memory cells, for coupling a bit line pair of the selected column to said write data line pair in response to a write column select signal activated according to an address signal in a write operation, each of said write gate circuits including a twisted line pair for alternating positions of the bit line pair of a corresponding column.

13. A semiconductor memory device, comprising:

a first bit line;

a second bit line forming a pair with said first bit line;

a first internal interconnection line aligned with said first bit line and coupled to said second bit line;

a second internal interconnection line aligned with said second bit line and coupled to said first bit line;

a third internal interconnection line aligned with said first internal interconnection line and coupled to said second internal interconnection line;

a fourth internal interconnection line aligned with said second internal interconnection line and coupled to said first internal interconnection line;

a first write data line provided above the first and second internal interconnection lines and extending in a direction intersecting said first and second internal interconnection lines;

a second write data line provided above the third and fourth internal interconnection lines and in a direction intersecting said third and fourth internal interconnection lines;

a first write gate for coupling said first internal interconnection line to said first write data line in response to a write instruction signal and a write column select signal activated according to an address signal in a write operation; and a second write gate for coupling said third internal interconnection line to said second write data line in response to said write column select signal and said write instruction signal.

14. The semiconductor memory device according to claim 13, wherein contact regions for coupling said first and second write data lines, respectively, with said first and second write gates are provided in alignment.

15. The semiconductor memory device according to claim 14, wherein the first and second bit lines are provided in plurality, and said contact regions each are shared by write gates provided for adjacent bit line pairs.

16. The semiconductor memory device according to claim 14, wherein the first and second bit lines are provided in plurality, and bit lines adjacent to one another in adjacent bit line pairs have a same attribute.

17. A semiconductor memory device, comprising:

a memory array having a plurality of memory cells arranged in rows and columns;

a write data line provided extending in a column direction over said memory array, for transmitting write data;

a read data line provided in parallel to said write data line over said memory array, for transmitting data read out from a selected memory cell of said memory array; and a conductive line provided between said read data line and said write data line over said memory cell array, for transmitting a prescribed voltage.

18. The semiconductor memory device according to claim 17, wherein said read data line and said write data line are each provided in plurality, and divided into write data line sets each including a plurality of write data lines and read data line sets each including a plurality of read data lines, and said conductive line is provided between a set of the write data lines and a set of the read data lines.

19. The semiconductor memory device according to claim 17, wherein said write data line, said read data line and said conductive line are formed at a same layer not lower than a third level metal interconnection layer.

20. A semiconductor memory device comprising:

at least first through third level metal interconnection lines formed at first through third level interconnection layers, respectively, the third level metal interconnection line carrying either of a signal and a fixed voltage other than an operation power supply voltages; and a memory array including memory cells and formed below said at least first through third level metal interconnection lines.

* * * * *

UNITED STATES PATENT AND TRADEMARK OFFICE
CERTIFICATE OF CORRECTION

PATENT NO. : 6,392,942 B2  Page 1 of 1
DATED : May 21, 2002
INVENTOR(S) : Hideyuki Noda et al.

It is certified that error appears in the above-identified patent and that said Letters Patent is hereby corrected as shown below:

<u>Title page,</u>
Item [73], Assignee, change "Mitsubisishi" to -- Mitsubishi --.

Signed and Sealed this

Twenty-seventh Day of August, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,392,942 B2
DATED : May 21, 2002
INVENTOR(S) : Hideyuki Noda et al.

It is certified that error appears in the above-identified patent and that said Letters Patent is hereby corrected as shown below:

<u>Title page,</u>
Item [73], should read as follows:
-- Mitsubishi Denki Kabushiki Kaisha --

Signed and Sealed this

Eighth Day of October, 2002

*Attest:*

JAMES E. ROGAN
*Attesting Officer*    *Director of the United States Patent and Trademark Office*